(12) United States Patent
Lee et al.

(10) Patent No.: US 10,937,519 B2
(45) Date of Patent: Mar. 2, 2021

(54) MEMORY DEVICES, MEMORY SYSTEMS AND METHODS OF OPERATING MEMORY DEVICES

(71) Applicant: SAMSUNG ELECTRONICS CO., LTD., Suwon-si (KR)

(72) Inventors: Yong-Jun Lee, Hwaseong-Si (KR); Tae-Hui Na, Seoul (KR); Chea-Ouk Lim, Hwaseong-Si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/813,889

(22) Filed: Mar. 10, 2020

(65) Prior Publication Data

US 2020/0211671 A1 Jul. 2, 2020

Related U.S. Application Data

(62) Division of application No. 16/128,879, filed on Sep. 12, 2018, now Pat. No. 10,629,286.

(30) Foreign Application Priority Data

Nov. 23, 2017 (KR) .......................... 10-2017-0157040

(51) Int. Cl.
*G11C 29/44* (2006.01)
*G06F 11/10* (2006.01)
(Continued)

(52) U.S. Cl.
CPC .......... *G11C 29/44* (2013.01); *G06F 11/1048* (2013.01); *G11C 8/10* (2013.01);
(Continued)

(58) Field of Classification Search
CPC .................................................. G06F 11/1048
See application file for complete search history.

(56) References Cited

U.S. PATENT DOCUMENTS 6,631,086 B1 10/2003 Bill et al.
6,956,772 B2 * 10/2005 Forbes ............... G11C 16/0466
365/185.18

(Continued)

OTHER PUBLICATIONS

Office Action dated Jul. 1, 2019 in Corresponding U.S. Appl. No. 16/128,879.

*Primary Examiner* — Douglas King
(74) *Attorney, Agent, or Firm* — F. Chau & Associates, LLC

(57) ABSTRACT

A memory device includes a memory cell array, a write/read circuit, a control circuit and an anti-fuse array. The memory cell array includes a plurality of nonvolatile memory cells. The write/read circuit performs a write operation to write write data in a target page of the memory cell array, verifies the write operation by comparing read data read from the target page with the write data and outputs a pass/fail signal indicating one of a pass or a fail of the write operation based on a result of the comparing. The control circuit controls the write/read circuit and selectively outputs an access address of the target page as a fail address in response to the pass/fail signal. The anti-fuse array in which the fail address is programmed, outputs a repair address that replaces the fail address.

7 Claims, 20 Drawing Sheets

(51) Int. Cl.
  *G11C 8/10* (2006.01)
  *G11C 29/00* (2006.01)
  *G11C 29/52* (2006.01)

(52) U.S. Cl.
  CPC .............. *G11C 29/52* (2013.01); *G11C 29/72* (2013.01); *G11C 29/76* (2013.01); *G11C 29/785* (2013.01); *G11C 2029/4402* (2013.01)

(56) References Cited

U.S. PATENT DOCUMENTS

| | | |
|---|---|---|
| 7,219,271 B2 | 5/2007 | Kleveland et al. |
| 9,032,141 B2 | 5/2015 | Bains et al. |
| 2005/0068816 A1 | 3/2005 | Yoshimatsu et al. |
| 2005/0248991 A1 | 11/2005 | Lee et al. |
| 2009/0046512 A1 | 2/2009 | Halloush et al. |
| 2010/0023800 A1 | 1/2010 | Harari et al. |
| 2010/0332895 A1 | 12/2010 | Billing et al. |
| 2012/0278651 A1 | 11/2012 | Muralimanohar et al. |
| 2014/0281693 A1 | 9/2014 | Jeddeloh et al. |
| 2014/0317469 A1* | 10/2014 | Sohn .................... G06F 11/1052 714/764 |
| 2015/0039848 A1 | 2/2015 | Chun et al. |
| 2015/0255169 A1* | 9/2015 | Sakamoto ............ G11C 29/789 327/525 |
| 2016/0027531 A1 | 1/2016 | Jones et al. |
| 2019/0156909 A1 | 5/2019 | Lee et al. |

* cited by examiner

MEMORY DEVICES, MEMORY SYSTEMS AND METHODS OF OPERATING MEMORY DEVICES

CROSS-REFERENCE TO RELATED APPLICATIONS

This US application claims is a divisional application of U.S. patent application Ser. No. 16/128,879 filed Sep. 12, 2018, which claims the benefit of priority under 35 USC § 119 to Korean Patent Application No. 10-2017-0157040, filed on Nov. 23, 2017, in the Korean Intellectual Property Office, the disclosures of which are incorporated by reference in their entirety herein.

BACKGROUND

1. Technical Field

The present disclosure relates to memories, and more particularly to memory devices, memory systems and methods of operating memory devices.

2. Discussion of Related Art

Volatile memory is computer storage that only maintains its data while the device is powered. Non-volatile memory is a type of computer memory that can retrieve stored information even after having been power cycled. Research into next-generation memory devices that are non-volatile and do not require refresh operations is being conducted in response to demand for high capacity and low power consumption memory devices. Next-generation memory devices generally require the high integrity characteristics of Dynamic Random Access Memory (DRAM), the non-volatile characteristics of flash memory, and the high speed of static RAM (SRAM). Examples of next-generation memory devices include Phase change RAM (PRAM), Nano Floating Gate Memory (NFGM), Polymer RAM (PoRAM), Magnetic RAM (MRAM), Ferroelectric RAM (FeRAM), and Resistive RAM (RRAM).

SUMMARY

At least one embodiment of the inventive concept provides a memory device having increased performance and endurance.

At least one embodiment of the inventive concept provides a memory system with increased performance and endurance.

At least one embodiment of the inventive concept provides a method of operating a memory device to have increased performance and endurance.

According to an exemplary embodiment of the inventive concept, a memory device includes a memory cell array, a write/read circuit, a control circuit and an anti-fuse array. The memory cell array includes a plurality of nonvolatile memory cells (e.g., cells to be overwritten). The write/read circuit performs a write operation to write write data in a target page of the memory cell array, verifies the write operation by comparing read data read from the target page with the write data and outputs a pass/fail signal indicating one of a pass and a fail of the write operation based on a result of the comparing. The control circuit controls the write/read circuit and selectively outputs an access address of the target page as a fail address in response to the pass/fail signal. The anti-fuse array in which the fail address is programmed, outputs a repair address that replaces the fail address.

According to an exemplary embodiment of the inventive concept, a memory system includes at least one memory device and a memory controller. The memory controller controls the at least one memory device. The at least one memory device includes a memory cell array, a write/read circuit, a control circuit and an anti-fuse array. The memory cell array includes a plurality of nonvolatile memory cells (e.g., cells to be overwritten). The write/read circuit performs a write operation to write write data in a target page of the memory cell array, verifies the write operation by comparing read data read from the target page with the write data and outputs a pass/fail signal indicating one of a pass or a fail of the write operation based on a result of the comparing. The control circuit controls the write/read circuit and selectively outputs an access address of the target page as a fail address in response to the pass/fail signal. The anti-fuse array in which the fail address is programmed, outputs a repair address that replaces the fail address.

According to an exemplary embodiment of the inventive concept, in a method of operating a memory device including a memory cell array that includes a plurality of nonvolatile memory cells (e.g., cells to be overwritten), a write operation is performed by a write circuit of the memory device to write write data in a target page of the memory cell array, the write operation is verified by the write circuit by comparing read data read from the target page with the write data, a repair address to replace the access address is generated by a control circuit of the memory device when a first number of different bits in the write data and the read data exceeds a reference number according to a result of the verifying, and the write data is written by the write circuit in a redundancy page, designated by the repair address, in the memory cell array.

According to an exemplary embodiment of the inventive concept, a memory device is provided. The memory device includes a memory cell array including a normal cell array and a redundancy cell array, an input/output circuit configured to perform a write operation to write write data in a target page of the memory cell array, configured to compare read data read from the target page with the write data and output a pass/fail signal indicating one of a pass and a fail of the write operation based on a result of the comparing, a control circuit configured to output an access address of the target page as a fail address when the pass/fail signal indicates the fail of the write operation, an anti-fuse array configured to output a repair address in response to receipt of the fail address, and a row decoder configured to select a word line connected to the redundancy cell array when the pass/fail signal indicates the fail of the write operation.

According to at least one embodiment of the inventive concept, the memory device may increase endurance of the memory cell array by writing write data in a redundancy page when a difference of bits between the write data and the read data exceeds a reference number or by storing the write data in a second page instead of a first page when the first page is intensively accessed.

BRIEF DESCRIPTION OF THE DRAWINGS

Exemplary embodiments of the inventive concept will be described below in more detail with reference to the accompanying drawings.

DETAILED DESCRIPTION OF THE EXEMPLARY EMBODIMENTS

The inventive concept will be described more fully hereinafter with reference to the accompanying drawings, in which exemplary embodiments thereof are shown. As used in the specification, the singular forms "a", "an" and "the" are intended to include the plural forms as well, unless the context clearly indicates otherwise.

Figure 1:
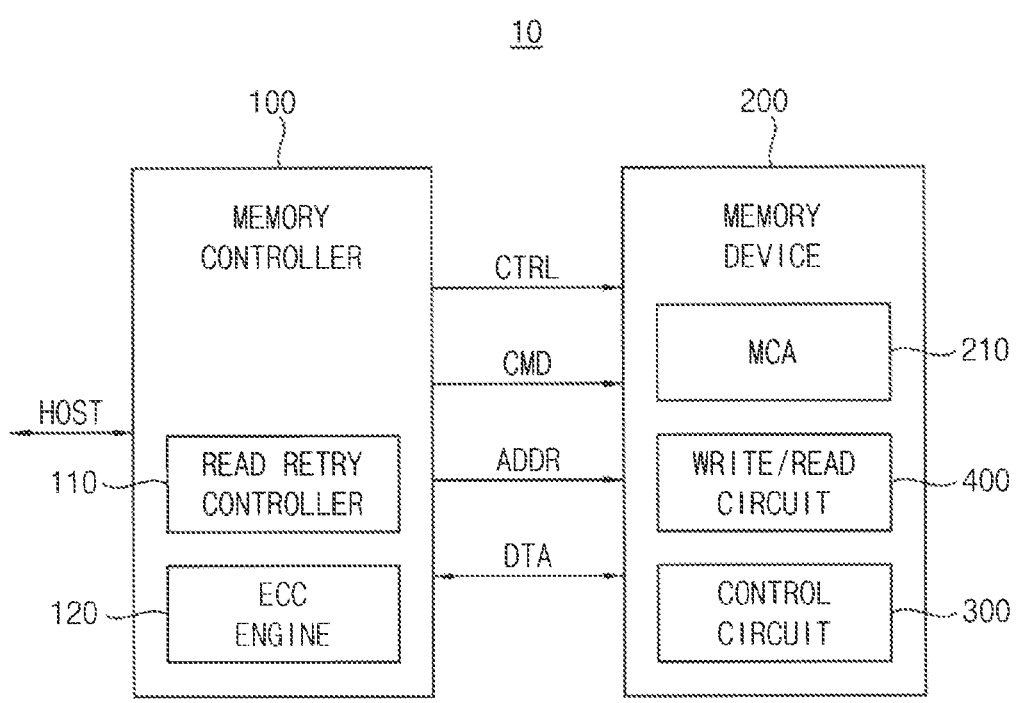
FIG. 1 is a block diagram illustrating a memory system according to an exemplary embodiment of the inventive concept.

FIG. 1 is a block diagram illustrating a memory system according to an exemplary embodiment of the inventive concept.

In exemplary embodiments, a memory device may be referred to as a resistive type memory device because the memory device includes resistive type memory cells. Alternatively, the memory device may include various types of memory cells. Since the memory cells are disposed at cross-points of multiple first signal lines and multiple second signal lines, the memory device may be referred to as a cross-point memory device.

Referring to FIG. 1, a memory system 10 includes a memory controller 100 and a memory device 200.

The memory device 200 includes a memory cell array 210, a control circuit 300 and a write/read circuit 400 (e.g., an input/output circuit). When the memory cell array 210 includes a plurality of resistive type memory cells, the memory system may be referred to as a resistive (type) memory system.

In response to a write/read request from a host, the memory controller 100 reads data stored in the memory device 200 or controls the memory device 200 to write data to the memory device 200. In an exemplary embodiment, the memory controller 100 provides an address ADDR, a command CMD, and a control signal CTRL to the memory device 200 to control a program (or write) operation and a read operation with respect to the memory device 200. For example, the command CMD could be a read or a write command. For example, the address ADDR may include the location within the memory device to write data to or read data from.

In addition, write-target data DTA and read data DTA may be exchanged between the memory controller 100 and the memory device 200. For example, the write-target data DTA can be written to the memory device 200 in response to the write command and the read data DTA can be read from the memory device 200 in response to the read command.

In addition, the memory controller 100 includes a read-retry controller 110 (e.g., a control circuit) and an error correction code (ECC) engine 120 (e.g., an ECC circuit). The ECC engine 120 may perform error detection and correction on data that is provided from the memory device 200. For example, the ECC engine 120 can detect whether the data has an error and potentially correct the error.

Although not illustrated, the memory controller 100 may include a random access memory (RAM), a processing unit, a host interface, and/or a memory interface. The RAM may be used as an operation memory of the processing unit. The processing unit may control operations of the memory controller 100. The host interface may include a protocol for exchanging data between the host and the memory controller 100.

The memory cell array 210 may include includes a plurality of memory cells (not shown) that are disposed respectively in regions where first signal lines and second signal lines cross. In addition, each of the memory cells may be a single level cell (SLC) that stores one bit data, or may be a multilevel cell (MLC) that stores at least two-bit data.

Alternatively, the memory cell array 210 may include both the SLCs and the MLCs. When one bit data is written to one memory cell, the memory cells may have two resistance level distributions according to the written data. Alternatively, when two-bit data is written to one memory cell, the memory cells may have four resistance level distributions according to the written data. In another embodiment, when a memory cell is a triple level cell (TLC) that stores three-bit data, the memory cells may have eight resistance level distributions according to the written data. However, embodiments of the inventive concept are not limited thereto. For example, each of the memory cells may store at least four-bit data in another embodiment.

In an embodiment, the memory cell array 210 includes memory cells with a two-dimensional horizontal structure. In another embodiment, the memory cell array 210 includes memory cells with a three-dimensional vertical structure.

The memory cell array 210 may include resistive-type memory cells that include a variable resistor device (not shown). For one example, when resistance of the variable resistor device that is formed of a phase change material (e.g., Ge—Sb—Te) is changed according to a temperature, a resistive memory device is a phase change RAM (PRAM). As another example, when the variable resistor device is formed of a complex metal oxide including an upper electrode, a lower electrode, and a transition metal oxide therebetween, the resistive memory device is a resistive RAM (RRAM). As another example, when the variable resistor device is formed of an upper electrode of a magnetic material, a lower electrode of the magnetic material, and a dielectric therebetween, the resistive memory device is a magnetic RAM (MRAM).

The write/read circuit 400 performs a write operation and a read operation on the memory cells. In an embodiment, the write/read circuit 400 is connected to the memory cells via the bit-lines, and includes write drivers (e.g., driving circuits) that write data to the memory cells, and sense amplifiers that sense resistive components of the memory cells.

In an embodiment, the control circuit 300 controls operations of the memory device 200, and controls the write/read circuit 400 so as to perform a memory operation such as a write operation or a read operation. For the write and read operations of the memory device 200, the control circuit 300 may provide pulse signals such as a write pulse or a read pulse to the write/read circuit 400. For example, the write/read circuit 400 may provide a write current (or a write voltage) in response to the write pulse to the memory cell array 210 and provide a read current (or a read voltage) in response to the read pulse to the memory cell array 210.

In the write operation with respect to the memory device 200, a resistance value of a variable resistor of a memory cell of the memory cell array 210 may be increased or decreased, depending on write data associated with the write operation. For example, each of the memory cells of the memory cell array 210 may have a resistance value according to data that is currently stored therein, and the resistance value may be increased or decreased, depending on data to be written to each of the memory cells. In an embodiment, the write operation is divided into a reset write operation and a set write operation. In a set state, a resistive memory cell may have a relatively low resistance value, and in a reset state, the resistive memory cell may have a relatively high resistance value. The reset write operation involves performing a write operation so as to increase a resistance value of a variable resistor of the resistive memory cell, and the set write operation involves performing a write operation so as to decrease the resistance value of the variable resistor of the resistive memory cell.

In an exemplary embodiment, when a detected error of data read by the memory device 200 is not correctable, the memory controller 100 controls the memory device 200 to operate in a read-retry mode to perform a read-retry operation. For example, the ECC engine 120 can determine whether the data read has an error and whether that error is correctable. During the read-retry operation, the memory device 200 reads (or re-reads) data while the memory device 200 changes a reference (e.g., a read reference) for determining data "0" and data "1", analyzes a valley in a resistance level distribution of memory cells by performing a data determination operation on the read data, and based on the analysis result, performs a recovery algorithm of selecting a read reference so as to an minimize error occurrence of the data. For example, the read reference could be a reference resistance, where the data is considered "0" below the reference resistance and "1" above the reference resistance or vice versa. For example, the recovery algorithm could increase or decrease a value of the reference resistance.

Figure 2:
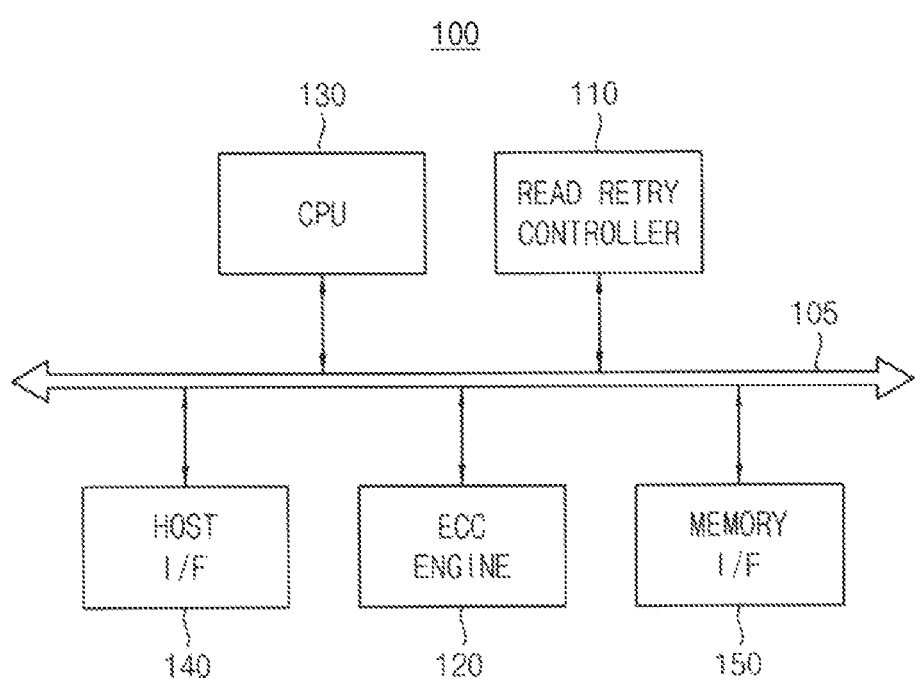
FIG. 2 is a block diagram illustrating the memory controller in FIG. 1 according to an exemplary embodiment of the inventive concept.

FIG. 2 is a block diagram illustrating the memory controller in FIG. 1 according to an exemplary embodiment of the inventive concept.

Referring to FIG. 2, the memory controller 100 includes the read-retry controller 110, the ECC engine 120, a central processing unit (CPU) 130, a host interface 140 and a memory interface 150. The read-retry controller 110, the ECC engine 120, the central processing unit (CPU) 130, the host interface 140 and the memory interface 150 may communicate with one another through a data bus 105.

The CPU 130 controls operations of the memory controller 100. For example, the CPU 130 may control various function blocks related to a memory operation on the memory device 200. The host interface 140 interfaces with the host. Examples of this interfacing include receiving a request for the memory operation from the host. For example, the host interface 140 receives, from the host, requests for reading and writing data, and in response to the requests, the host interface 140 generates internal signals for the memory operation on the memory device 200.

In an embodiment, the ECC engine 120 performs an ECC encoding process on write data and an ECC decoding process on read data. For example, the ECC engine 120 may perform an error detection operation on data that is read from the memory device 200, and may perform an error correction operation on the read data when a result of the error detection operation indicates an error is present. The read-retry controller 110 may provide various types of information for controlling an operation of the memory device 200 during the read-retry mode, as previously described. The memory interface 150 interfaces with the memory device 200 to exchange various signals (e.g., command, address, mode signals, reference information, data, etc.) between the memory controller 100 and the memory device 200.

Figure 3:
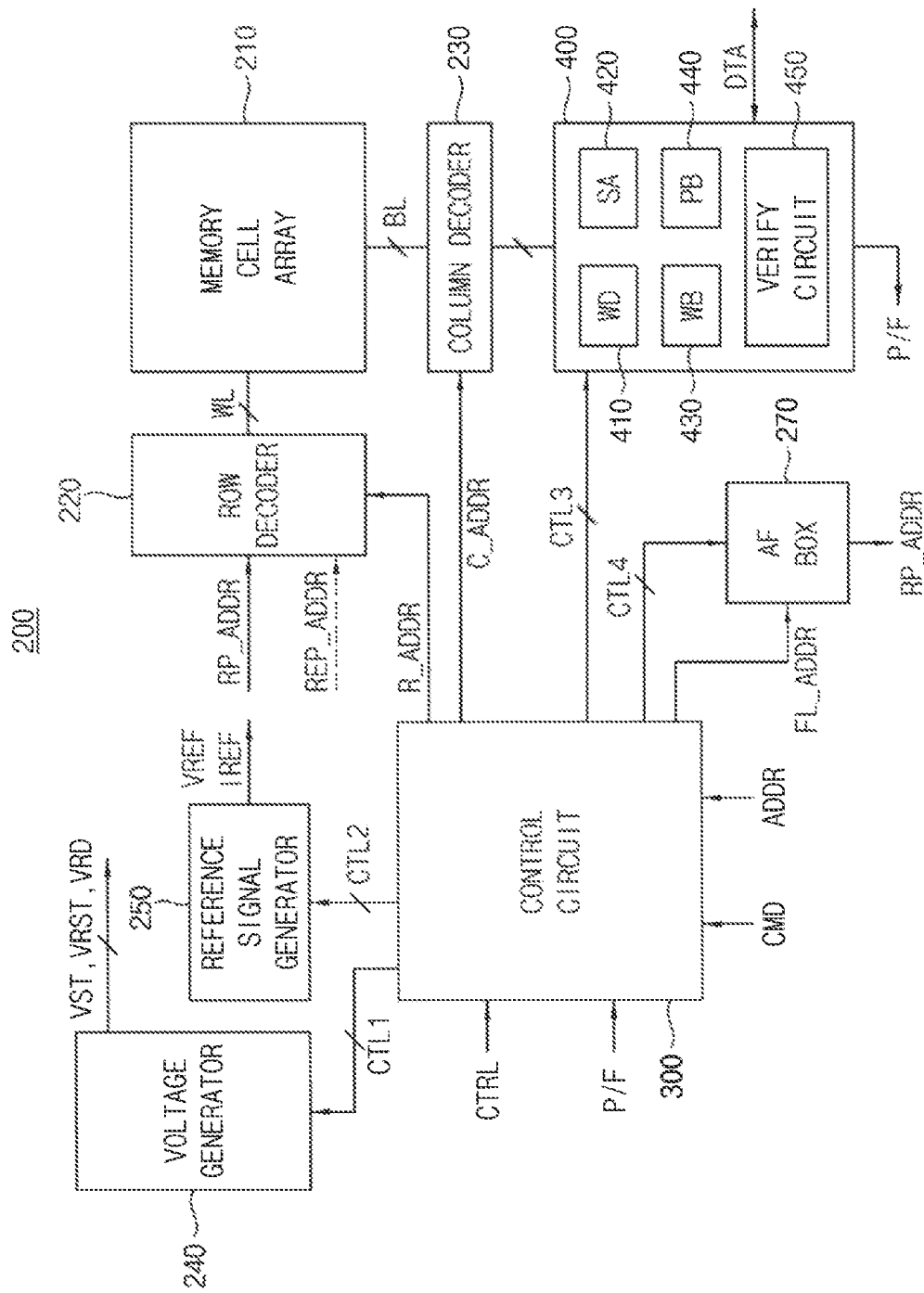
FIG. 3 is a block diagram illustrating the memory device in FIG. 1 according to an exemplary embodiment of the inventive concept.

FIG. 3 is a block diagram illustrating the memory device in FIG. 1 according to an exemplary embodiment of the inventive concept.

Referring to FIG. 3, the memory device 200 includes the memory cell array 210, the control circuit 300 and the write/read circuit 400. The memory device 200 may further include a row decoder 220 (e.g., a decoder circuit), a column decoder 230 (e.g., a decoder circuit), a voltage generator 240, a reference signal generator 250 and an anti-fuse box 270. The write/read circuit 400 may include a write driver 410, a sense amplifier 420, a write buffer 430, a page buffer 440 and a verify circuit 450.

Memory cells that are arranged in the memory cell array 210 are connected to word-lines WL and bit-lines BL. Since various voltage signals or current signals are provided via the bit-lines BL and the word-lines WL, data may be written to or read from selected memory cells, and writing data to or reading data from residual unselected memory cells may be prevented.

The address (or, access address) ADDR accompanied with the command CMD for indicating an access-target memory cell may be received by the control circuit 300. In an embodiment, the address ADDR includes a row address R_ADDR for selecting word-lines WL of the memory cell array 210, and a column address C_ADDR for selecting bit-lines BL of the memory cell array 210. The row decoder 220 performs a word-line selecting operation in response to the row address R_ADDR, and the column decoder 230 performs a bit-line selecting operation in response to the column address C_ADDR.

The write/read circuit 400 may be connected to the bit-lines BL and thus may write data to a memory cell or may read data from the memory cell. For example, a set voltage VST or a reset voltage VRST may be provided from the voltage generator 240 to a selected memory cell, and in a read operation, a read voltage VRD may be provided from the voltage generator 240 to the selected memory cell. The write/read circuit 400 may provide a write voltage or a write current according to data to the memory cell array 210 via the column decoder 230. In addition, in order to determine the data in the read operation, the write/read circuit 400 may include a comparator that is connected to a node (e.g., a sensing node) of a bit-line BL, and may read a data value by performing a comparison operation on a sensing voltage or a sensing current of the sensing node. A reference voltage VREF and/or a reference current IREF may be provided to the write/read circuit 400 and thus may be used in a data determination operation. The reference signal generator 250 may generate the reference voltage VREF and/or the reference current IREF.

In addition, the write/read circuit 400 may provide the control circuit 300 with a pass/fail signal P/F according to a read result with respect to the read data. The control circuit 300 may refer to the pass/fail signal P/F and thus control write and read operations of the memory cell array 210. For example, if the write/read circuit 400 attempts to write data to a particular address of the memory cell array 210 and data read from the address is not the same as the data it attempted to write, it can be concluded that the prior write failed (e.g., pass/fail signal indicates fail). For example, if the write/read circuit 400 attempts to write data to a particular address of the memory cell array 210 and data read from the address is the same as the data it attempted to write, it can be concluded that the prior write passed (e.g., pass/fail signal indicates pass).

In an exemplary embodiment, when the pass/fail signal P/F indicates a fail of the write operation, the control circuit 300 provides the anti-fuse box 270 with a row address of a target page of the memory cell array 210, associated with the write operation as a fail address FL_ADDR. The anti-fuse box 270 is programmed with the fail address FL_ADDR and outputs a repair address RP_ADDR to the row decoder 220 to replace the fail address FL_ADDR. By providing the repair address RP_ADDR to the row decoder 220 to replace the fail address FL_ADDR, a repair operation is performed on the row address of the target page associated with the failed write operation. For example, the data it attempted to write to the fail address FL_ADDR can be written to the repair address RP_ADDR.

In an exemplary embodiment, the control circuit 300 generates a plurality of control signals CTL1~CTL4 based on the command CMD, the address ADDR, the control signal CTRL and the pass/fail signal P/F. In an embodiment, the control circuit 300 provides a first control signal CTL1 to the voltage generator 240, provides a second control signal CTL2 to the reference signal generator 250, provides a third control signal CTL3 to the write/read circuit 400 and provides a fourth control signal CTL4 to the anti-fuse box 270.

Figure 4:
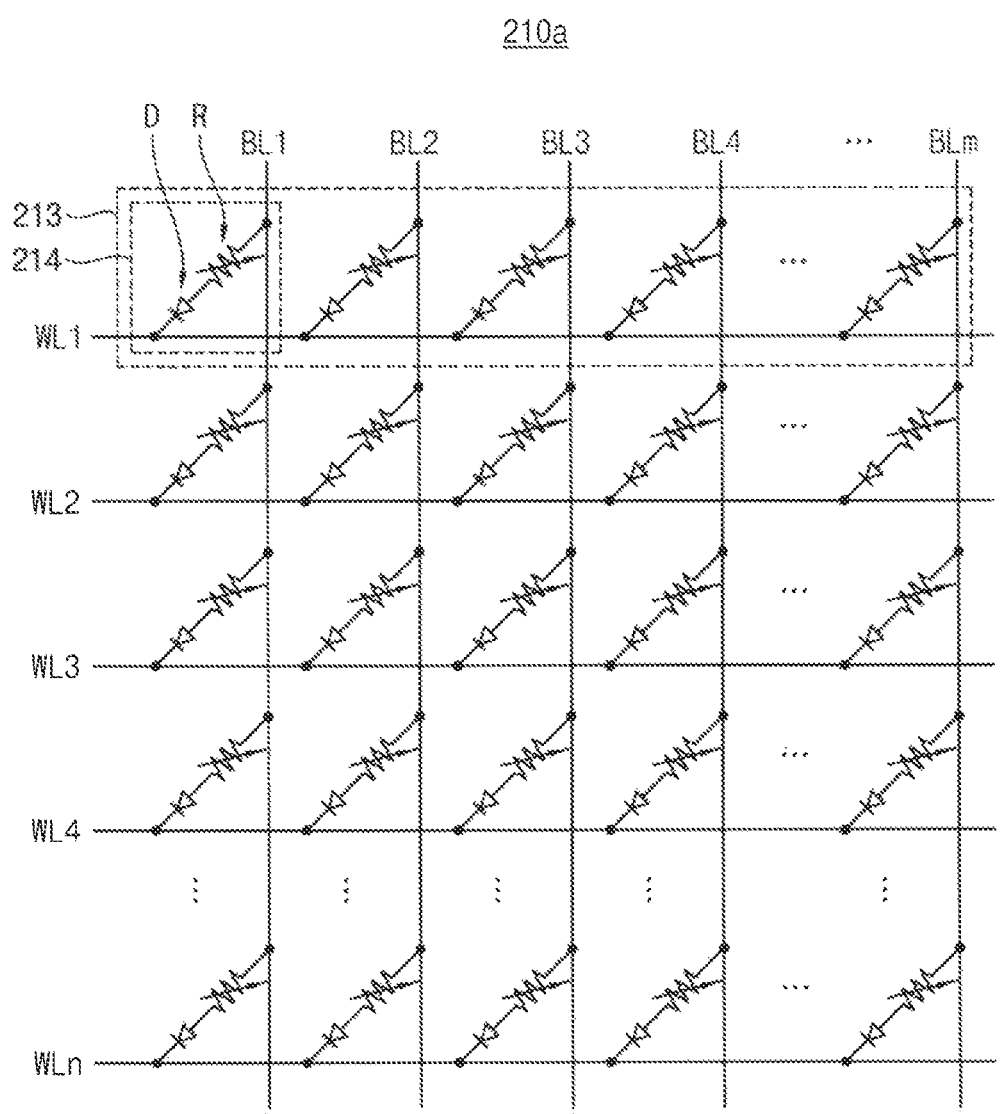
FIG. 4 is a circuit diagram illustrating an example of the memory cell array in FIG. 3 according to an exemplary embodiment of the inventive concept.

FIG. 4 is a circuit diagram illustrating an example of the memory cell array in FIG. 3 according to an exemplary embodiment of the inventive concept.

A memory cell array 210a includes multiple cells, and FIG. 4 shows an example of a cell array having a cell block including these multiple cells.

Referring to FIG. 4, the memory cell array 210a includes multiple word-lines WL1 through WLn, multiple bit-lines BL1 through BLm, and multiple memory cells 214. While FIG. 4 illustrates five word-lines WL, the inventive concept is not limited thereto as there may be fewer than five or more than five word-lines WL. The memory cells MC connected to one word-line may be defined as a page unit 213.

In an embodiment, each of the memory cells MC includes a variable resistor R and a selection device D. Here, the variable resistor R may be referred to as a variable resistor device or a variable resistor material, and the selection device D may be referred to as a switching device (e.g., a diode). The variable resistor R is connected between one of the bit-lines BL1 through BLm and the selection device D, and the selection device D is connected between the variable resistor device R and one of the word-lines WL1 through WLn.

A resistance value of the variable resistor R may be changed to one of multiple resistive states. For example, the resistance value may change in response to an electric pulse being applied to the corresponding variable resistor R. In an embodiment, the variable resistor R includes a phase-change material having a crystal state that changes according to a current. The phase-change material may include materials, such as GaSb, InSb, InSe, or $Sb_2Te_3$ obtained by compounding two elements, GeSbTe, GaSeTe, InSbTe, $SnSb_2Te_4$, or InSbGe obtained by compounding three elements, or AgInSbTe, (GeSn)SbTe, GeSb(SeTe) obtained by compounding four elements.

In an embodiment, the phase-change material has an amorphous state that is relatively high-resistive, and a crystal state that is relatively low-resistive. A phase of the phase-change material may be changed by Joule's heat that is generated by the current. Using changes of the phase, data may be written to the corresponding cell.

In another embodiment, the variable resistor R does not include the phase-change material, but includes perovskite compounds, transition metal oxide, magnetic materials, ferromagnetic materials, or antiferromagnetic materials, for example.

The selection device D is connected between one of the word-lines WL1 through WLn and the variable resistor R, and according to a voltage applied to the connected word-line and bit-line, a current that is supplied to the variable resistor R is controlled. In a present exemplary embodiment of the inventive concept, the selection device D is a PN-junction diode or a PIN-junction diode. An anode of the diode may be connected to the variable resistor R, and a cathode of the diode may be connected to one of the word-lines WL1 through WLn. Here, when a voltage difference between the anode and the cathode of the diode is greater than a threshold voltage of the diode, the diode is turned on so that the current is supplied to the variable resistor R. Conversely, when the voltage difference between the anode and the cathode of the diode is less the threshold voltage of the diode, the diode is turned off.

Figure 5A:
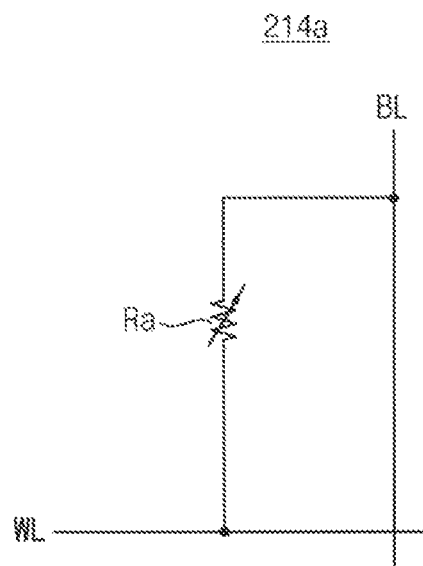
FIGS. 5A through 5C are circuit diagrams of examples of a memory cell in FIG. 4.
Figure 5B:
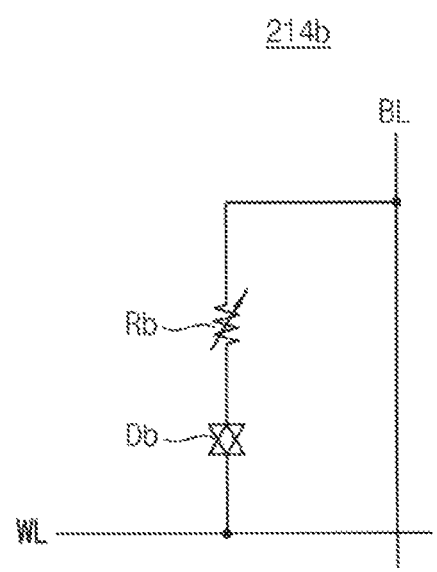
Figure 5C:
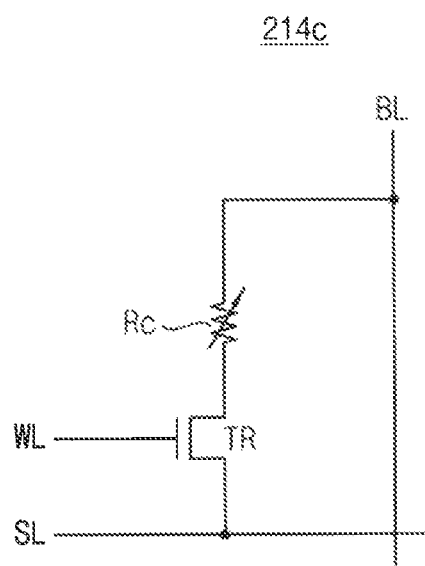

FIGS. 5A through 5C are circuit diagrams of examples of a memory cell in FIG. 4.

Referring to FIG. 5A, a memory cell 214a includes a variable resistor Ra connected between a bit-line BL and a word-line WL. The memory cell 214a stores data due to voltages that are applied to the bit-line BL and the word-line WL, respectively.

Referring to FIG. 5B, a memory cell 214b includes a variable resistor Rb and a bidirectional diode Db. The variable resistor Rb includes a resistive material so as to store data. The bidirectional diode Db is connected between the variable resistor Rb and a word-line WL, and the variable resistor Rb is connected between a bit-line BL and the bidirectional diode Db. In an alternative configuration, positions of the bidirectional diode Db and the variable resistor Rb are changed with respect to each other. By using the bidirectional diode Db, leakage current that may flow through a non-selected resistor cell may be cut (e.g., eliminated or reduced).

Referring to FIG. 5C, a memory cell 214c include a variable resistor Rc and a transistor TR. The transistor TR is a selection device (i.e., a switching device), which supplies or cuts a current to the variable resistor Rc, according to a voltage of a word-line WL. In the embodiment of FIG. 5C, in addition to the word-line WL, a source line SL is additionally arranged to adjust voltage levels at both ends of the variable resistor Rc. The transistor TR is connected between the variable resistor Rc and the source line SL, and the variable resistor R is connected between a bit-line BL and the transistor TR. In an alternative configuration, positions of the transistor TR and the variable resistor Rc are changed with respect to each other. The memory cell 214c is selected or not selected according to the ON or OFF state of the transistor TR that is driven by the word-line WL.

Figure 6:
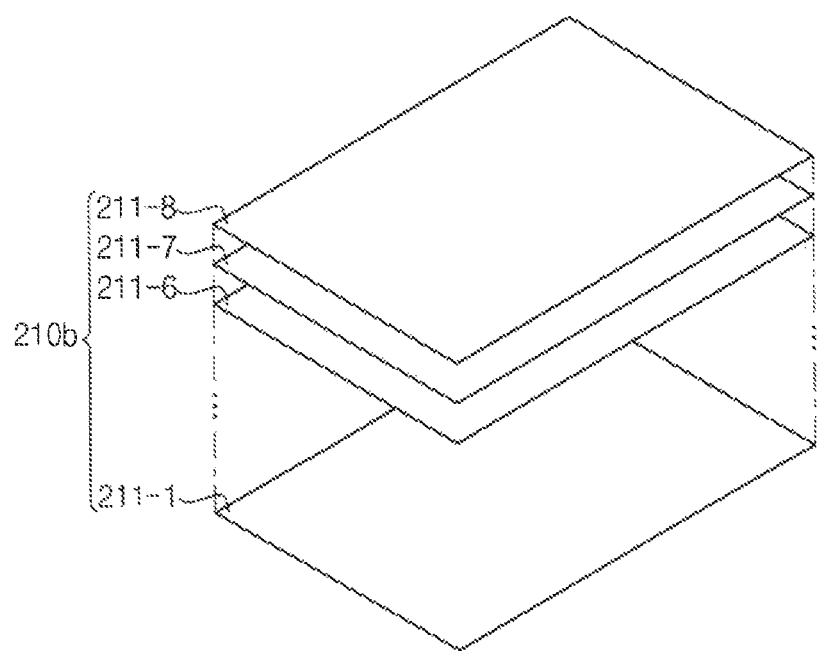
FIG. 6 is a diagram illustrating another example of the memory cell array in FIG. 3.

FIG. 6 is a diagram illustrating another example of the memory cell array in FIG. 3.

Referring to FIG. 6, a memory cell array 210b is implemented with a three-dimensional stacked structure. The exemplary three-dimensional stacked structure includes multiple, vertically stacked, memory cell layers 211_1~211_8. However, those skilled in the art will understand that the number of vertically stacked memory cell layers is an arbitrary one.

Each of the memory cell layers 211_1~211_8 may include a normal cell array and a redundancy cell array. When the memory cell array 210b has a three-dimensional laminated structure, each of the memory cell layers 211_1~211_8 has the cross point structure illustrated in FIG. 4.

Figure 7A:
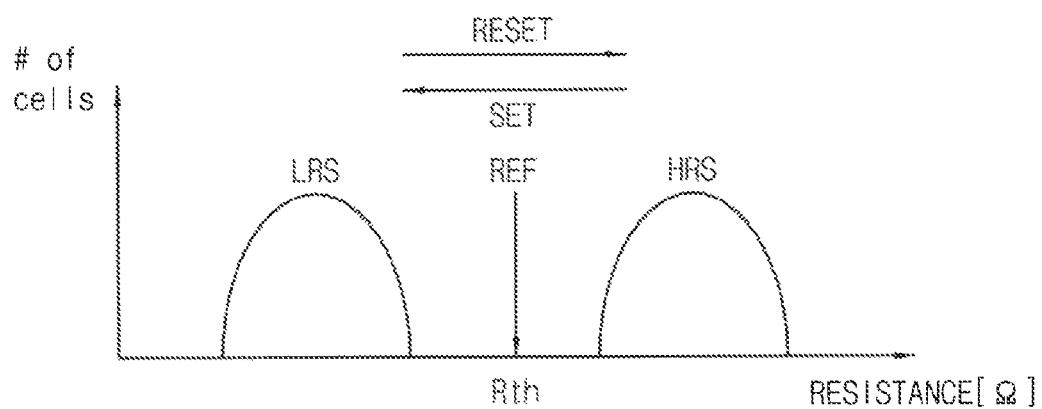
FIG. 7A illustrates a graph showing an example of a distribution of a memory cell with respect to a resistance when the memory cell of FIG. 4 is a single-level cell.

FIG. 7A illustrates a graph showing an example of a distribution of a memory cell with respect to a resistance when the memory cell of FIG. 4 is a single-level cell.

Referring to FIG. 7A, a horizontal axis denotes a resistance, and a vertical axis denotes the number of memory cells. For example, if a memory cell (for example, the memory cell 124) is a single-level cell to which 1 bit is programmed, the memory cell can have a low resistance state LRS or a high resistance state HRS. A set operation or a set write operation refers to a switching operation for the memory cell 124 from the high resistance state HRS to the low resistance state LRS by applying a write pulse to the memory cell. In addition, a reset operation or a reset write operation refers to a switching operation for the memory cell from the low resistance state LRS to the high resistance state HRS by applying a write pulse to the memory cell.

A resistance between the distribution of the low resistance state LRS and the distribution of the high resistance state HRS may be set to be a threshold resistance Rth. In a read operation performed on a memory cell, when a read result is equal to or greater than the threshold resistance Rth, the read result may be determined to be the high resistance state HRS, and when the read result is less than threshold resistance Rth, the read result may be determined to be the low resistance state LRS. In an embodiment, information on a read reference REF corresponding to the threshold resistance Rth is received from the memory controller 100. For example, the information may be used to determine the threshold resistance Rth of a memory cell.

Figure 7B:
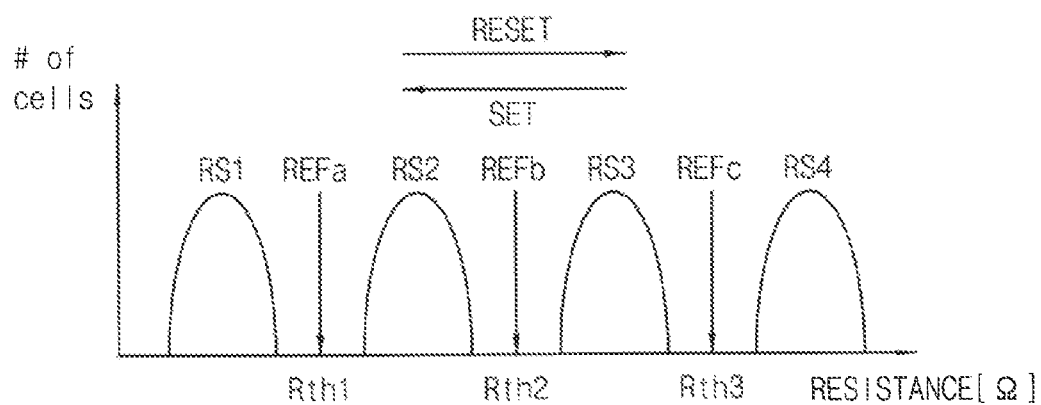
FIG. 7B illustrates a graph showing an ideal distribution of a memory cell with respect to a resistance when the memory cell of FIG. 4 is a multi-level cell.

FIG. 7B illustrates a graph showing an ideal distribution of a memory cell with respect to a resistance when the memory cell of FIG. 4 is a multi-level cell.

Referring to FIG. 7B, the horizontal axis denotes resistance, and the vertical axis denotes the number of memory cells. For example, if a memory cell is a multi-level cell to which 2 bits are programmed, the memory cell may have one of a first resistance state RS1, a second resistance state RS2, a third resistance state RS3, and a fourth resistance state RS4. In an embodiment, the first resistance state RS1 and the second resistance state RS2 may be referred to as a low resistance state while the third resistance state RS3 and the fourth resistance state RS4 may be referred to as a high resistance state.

A resistance between the distribution of the first resistance state RS1 and the distribution of the second resistance state RS2 may be set to be a first threshold resistance Rth1; a resistance between the distribution of the second resistance state RS2 and the distribution of the third resistance state RS3 may be set to be a second threshold resistance Rth2; and a resistance between the distribution of the third resistance state RS3 and the distribution of the fourth resistance state RS4 may be set to be a third threshold resistance Rth3. In a read operation performed on the memory cells 214, when a read result is equal to or greater than the first threshold resistance Rth1, the read result may be determined to be one of the second to fourth resistance states RS2, RS3, and RS4, and when the read result is less than the first threshold resistance Rth1, the read result may be determined to be the first resistance state RS1. In an embodiment, information on read references REFa, REFb, and REFc respectively corresponding to the first, second, and third threshold resistances Rth1, Rth2, and Rth3 are received from the memory controller 100.

Figure 8A:
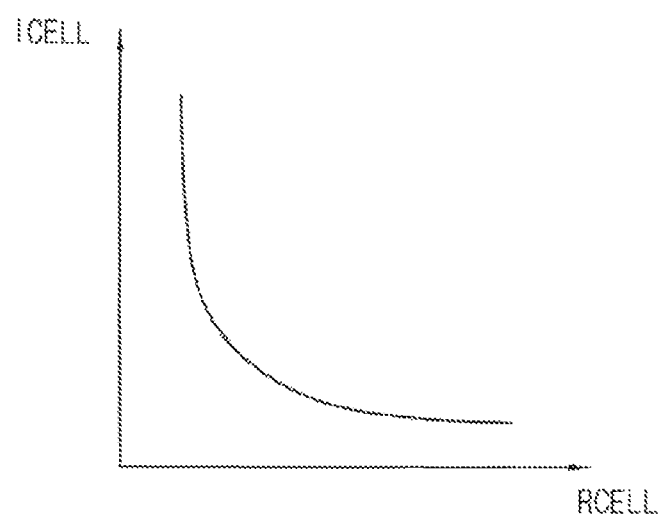
FIG. 8A illustrates a graph showing a cell current flowing in a memory cell with respect to resistance.

FIG. 8A illustrates a graph showing a cell current flowing in a memory cell with respect to resistance.

Referring to FIG. 8A, the horizontal axis denotes a resistance level RCELL of a memory cell, and the vertical axis denotes a cell current ICELL flowing in the memory cell. The cell current ICELL is inversely proportional to the resistance level RCELL, and thus, the cell current ICELL non-linearly decreases with respect to the resistance level RCELL. In detail, when the resistance level RCELL is low, the cell currents ICELL changes by a relatively large amount in response to a resistance change, whereas when the resistance level RCELL is high, the cell current ICELL changes by a relatively small amount in response to the same change of resistance as stated above. Accordingly, when the resistance level RCELL is high, a sensing margin may dramatically decrease.

Figure 8B:
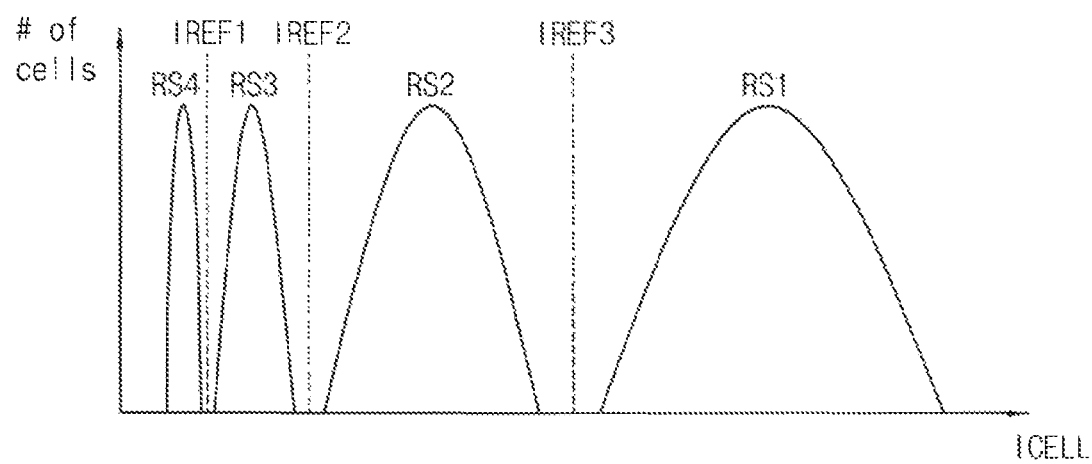
FIG. 8B illustrates a graph showing an example of an actual distribution of a memory cell with respect to a cell current when the memory cell is a multi-level cell.

FIG. 8B illustrates a graph showing an example of an actual distribution of a memory cell with respect to a cell current when the memory cell is a multi-level cell.

Referring to FIG. 8B, the horizontal axis denotes a cell current ICELL flowing in a memory cell, and the vertical axis denotes the number of memory cells. When the memory cell is a multi-level cell, the memory cell may have one of a first resistance state RS1, a second resistance state RS2, a third resistance state RS3, and a fourth resistance state RS4.

For example, when reading data stored in a memory cell, the cell current ICELL is compared with a reference current IREF, and then the reference current IREF may be changed to detect the data stored in the memory cell. The reference current IREF may be determined to be one of first, second, and third reference currents IREF1, IREF2, and IREF3, and the first, second, and third reference currents IREF1, IREF2, and IREF3 may respectively correspond to third, second, and first threshold resistances (for example, Rth3, Rth2, and Rth1 of FIG. 7B).

Figure 9A:
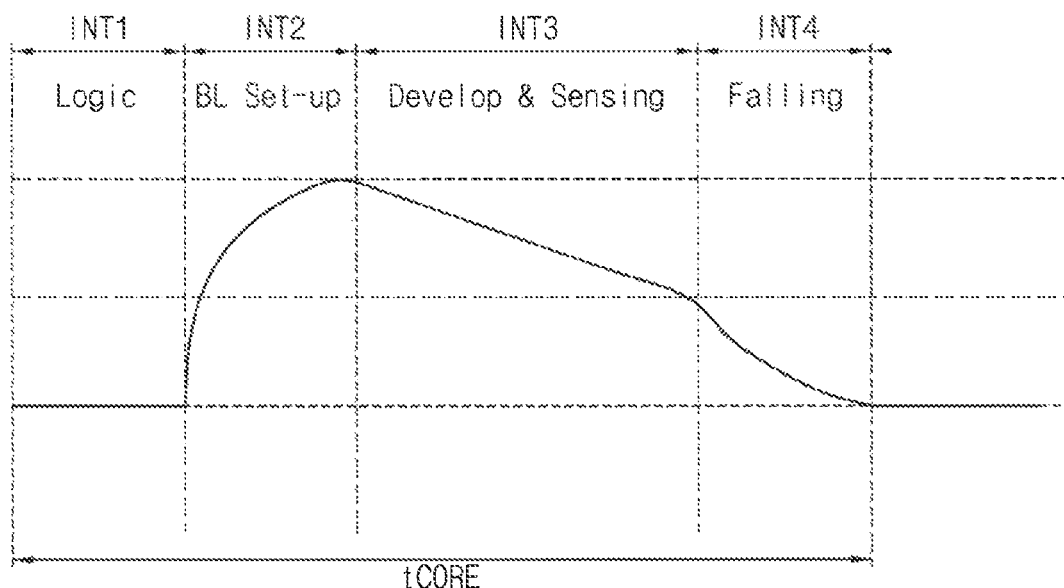
FIG. 9A is a graph that illustrates an example of a waveform of a read operation performed by the memory device according to an exemplary embodiment of the inventive concept.

FIG. 9A is a graph that illustrates an example of a waveform of a read operation performed by the memory device according to an exemplary embodiment of the inventive concept.

As illustrated in FIG. 9A, the read operation includes a series of intervals, e.g., a logic interval INT1, a bit-line set-up interval INT2, a developing/sensing interval INT3, and a falling interval INT4. During the logic interval INT1, an operation, such as a command and address decoding operation of selecting a memory cell, may be performed. Then, since a set-up operation is performed on a bit-line connected to the selected memory cell, the bit-line may be precharged to a predetermined level during the bit-line set-up interval INT2.

During the developing/sensing interval INT3, since current flows to the selected memory cell, a voltage that is applied to a sensing node may be changed, and data that is stored in the selected memory cell is sensed in the developing/sensing period. Afterward, during the falling interval INT4, a voltage of the bit-line is discharged. The logic interval through the falling interval may be repeatedly performed in a next read operation.

As shown in FIG. 9A, the resistive memory device or the phase change memory device has a shorter read time tCORE for a read operation than other non-volatile memories. Therefore, the flash memory reads data of relatively many cells during one read time tCORE, whereas the resistive memory device may read data of a relatively small number of cells via multiple read operations.

Figure 9B:
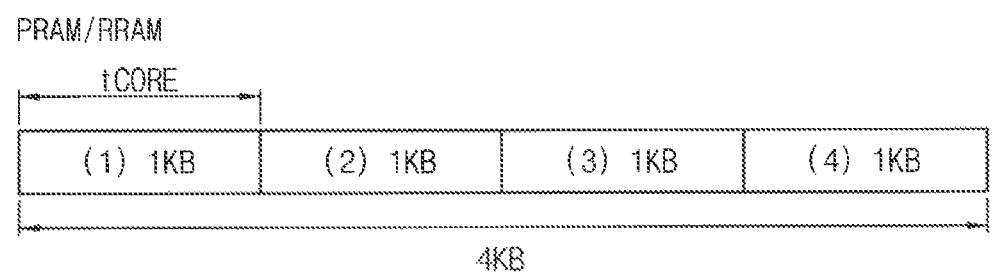
FIG. 9B illustrate examples in which read data is stored in a page buffer in the memory device of FIG. 3.

FIG. 9B illustrate examples in which read data is stored in a page buffer in the memory device of FIG. 3.

Referring to FIG. 9B, the memory device 200 such as a RRAM or a PRAM includes one page including multiple cell regions (e.g., four cell regions), and reads data of one cell region via one read operation. For example, data of a cell region that corresponds to 1 KB is read via one read operation, and the read data is stored in a partial storage area of the page buffer 440. Accordingly, data of four cell regions are read via four read operations. The data that corresponds to 4 KB and is read from the four cell regions may be stored in the page buffer.

Similarly, data that corresponds to 1 KB and is physically remote may be read via one read operation and may be stored in the page buffer 440. For example, the page buffer 440 may include four regions, each having 1 KB, and data that is read via one read operation may be split and saved in the four regions. Afterward, data that is read via a second read operation may be split and may be saved in the four regions, and by repeatedly doing the read operation, all of data may be stored in the page buffer 440.

Figure 10:
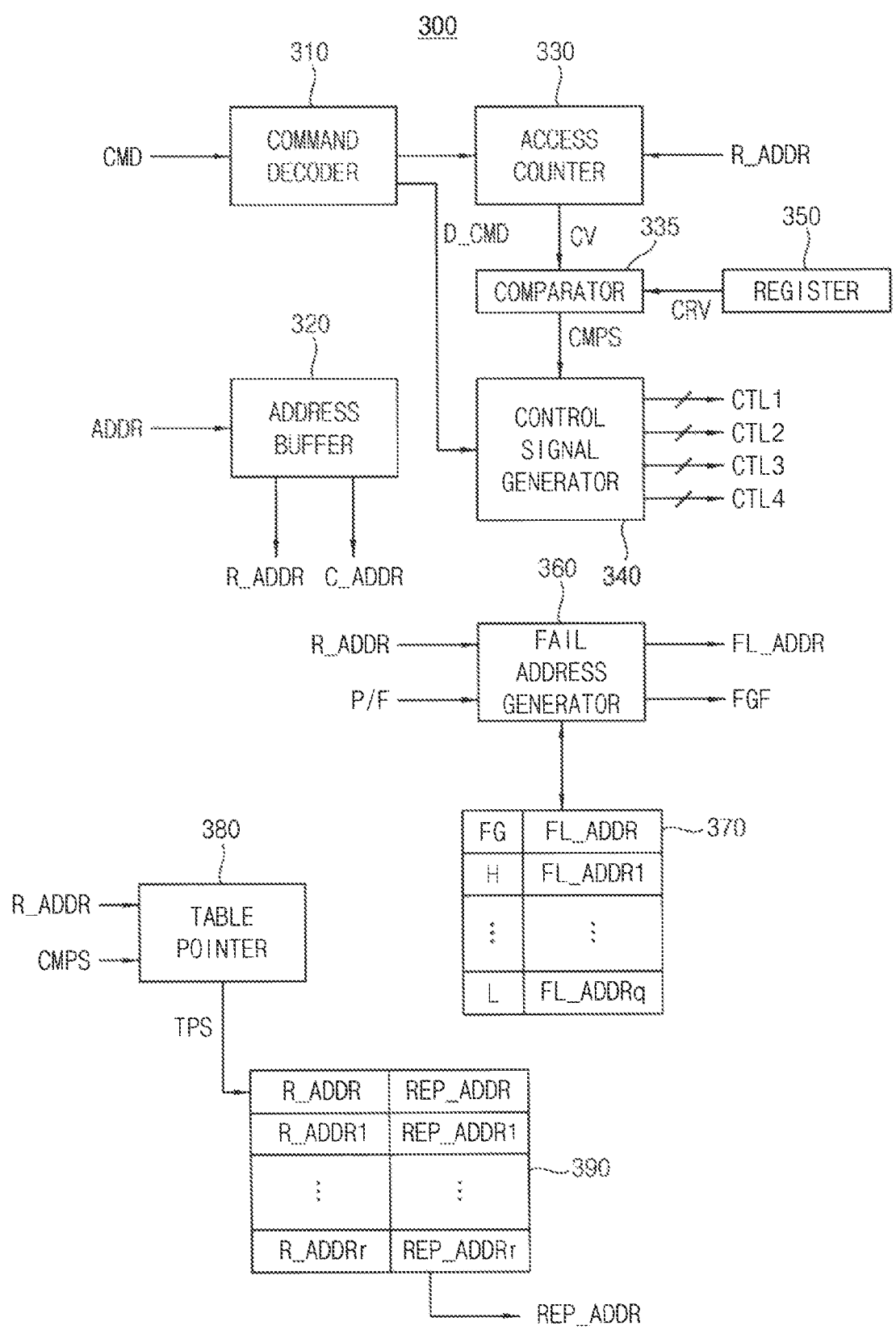
FIG. 10 is a block diagram illustrating an example of the control circuit in the memory device of FIG. 3 according to an exemplary embodiment of the inventive concept.

FIG. 10 is a block diagram illustrating an example of the control circuit in the memory device of FIG. 3 according to an exemplary embodiment of the inventive concept.

Referring to FIG. 10, the control circuit 300 includes a command decoder 310 (e.g., a decoding circuit), an address buffer 320, a row access counter 330 (e.g., a hardware counter or counter circuit), a comparator 335, a control signal generator 340, a register 350, a fail address generator 360 (e.g., a logic circuit), a flag table 370, a table pointer 380 (e.g., a pointer table) and a storing table 390.

The command decoder 310 decodes the command CMD to generate a decoded command D_CMD and provides the decoded command D_CMD to the control signal generator 340. When the decoded command D_CMD is a write command, the command decoder 410 provides the decoded command D_CMD to the to the row access counter 330.

The address buffer 320 receives the address ADDR, provides the row address R_ADDR to the row decoder 220, the row access counter 330, the fail address generator 360 and the table pointer 380 and provides the column address C_ADDR to the column decoder 230.

In an embodiment, the row access counter 330 counts a row access number to a first row address (i.e., a selected page) associated with the write operation to generate a counting value CV indicating a counted row access number and provides the comparator 335 with the counting value CV.

The register 350 stores a reference value CRV associated with the row access number and provides the reference value CRV to the comparator 335. The comparator 335 compares the counting value CV indicating the counted row access number with the reference number CRV to generate a comparison signal CMPS indicating a result of the comparison of the counting value CV and the reference number CRV and provides the comparison signal CMPS to the control signal generator 340 and the table pointer 380.

The control signal generator 340 receives the decoded command D_CMD and the comparison signal CMPS and generates the first through fourth control signals CTL1~CTL4 in response to an operation designated by the decoded command D_CMD and the row access count indicated by the comparison signal CMPS.

The fail address generator 360 receives the row address R_ADDR and the pass/fail signal P/F. In an embodiment, the fail address generator 360 outputs the row address R_ADDR as the fail address FL_ADDR when the pass/fail signal P/F indicates a fail of the write operation. While the fail address generator 360 outputs the fail address FL_ADDR, the fail address generator 360 stores the fail address FL_ADDR in a row of the flag table 370 and changes a logic level of a flag signal FG in the row associated with the fail address FL_ADDR to a high level. Since redundancy resources to replace the fail address FL_ADDR in the memory cell array 210 is limited, the fail address generator 360 may output a flag-full signal FGF indicating that no available redundancy resources exist in the memory cell array 210 when logic levels of flag signals FL in all rows of the flag table 370 have been changed to high levels.

The flag table 370 may include a first column corresponding to one of a plurality of fail addresses FL_ADDR1~FL_ADDRq (q is a natural number greater than one) and a second column representing the flag signal FG whose logic level indicates an availability of a redundancy resource corresponding to each of the fail addresses FL_ADDR1~FL_ADDRq.

When the write operation fails after the fail address generator 360 outputs the flag-full signal FGF, the control circuit 300 may notify the memory controller of the fail of the write operation because there is no redundancy resource to replace the fail address.

The storing table 390 stores row addresses R_ADDR1~R_ADDRr (r is a natural number greater than one) and replacement addresses REP_ADDR1~REP_ADDRr. Each of the replacement addresses REP_ADDR1~REP_ADDRr may replace a corresponding one of the row addresses R_ADDR1~R_ADDRr. The table pointer 380 (e.g., a pointer table) receives the row-address R_ADDR and the comparison signal CMPS and outputs a table pointing signal TPS designating the row address ROW_ADDR when the comparison signal CMPS indicates that the row access count to the row address ROW_ADDR exceeds the reference value CRV. For example, the table pointing signal TPS may be used to index into the storing table 390 to access an entry associated with the row-address R_ADDR that includes a corresponding replacement address. The storing table 390 outputs the replacement (row) address REP_ADDR corresponding the row address ROW_ADDR designated by the table pointing signal TPS to the row decoder 220.

The row decoder 220 may update the row addresses R_ADDR1~R_ADDRr in the storing table 390.

Figure 11:
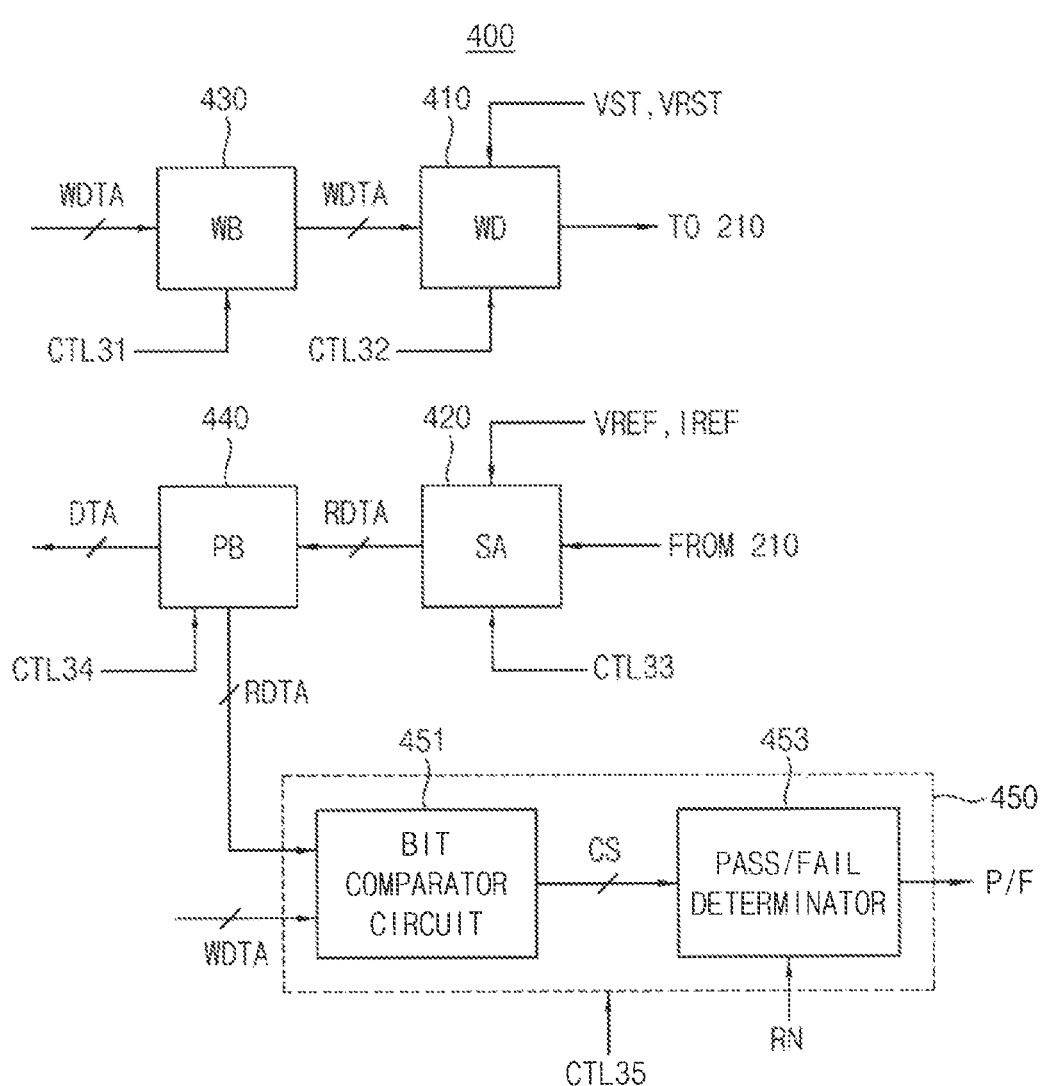
FIG. 11 is a block diagram illustrating an example of the write/read circuit in the memory device of FIG. 3 according to an exemplary embodiment of the inventive concept.

FIG. 11 is a block diagram illustrating an example of the write/read circuit in the memory device of FIG. 3 according to an exemplary embodiment of the inventive concept.

Referring to FIG. 11, the write/read circuit 400 includes the write buffer 430, the write driver 410, the sense amplifier 420, the page buffer 440 and the verify circuit 450. The verify circuit 450 includes a bit comparator circuit 451 and a pass/fail determinator 453 (e.g., a logic circuit).

The write buffer 430 stores write data WDTA in a write operation and provides the write data WDTA to the write driver 410 or the verify circuit 450 in response to a first sub control signal CTL31.

The write driver 410 performs a write operation to store the write data WDTA in the memory cells when the set voltage VST or the reset voltage VRST is provided to the memory cells of the target page in response to a second sub control signal CTL32.

The sense amplifier 420 senses the data stored in the memory cells of the target page by using the reference voltage VREF or the reference current IREF and provides the read data RDTA to the page buffer 440 in response to a third sub control signal CTL33. The page buffer 440 provides the read data RDTA to the verify circuit 450 in a verify mode and provides the read data RDTA as data to outside of the memory device 200 in an output mode in case of a pass of the write operation, in response to a fourth sub control signal CTL34.

The verify circuit 450 compares corresponding bits of first data bits of the write data WDTA and second data bits of the read data RDTA and outputs the pass/fail signal P/F indicating pass of fail of the write operation based on a result of the comparison in the verify mode, in response to a fifth sub control signal CTL35.

The bit comparator circuit 451 compares corresponding bits of the first data bits of the write data WDTA and the second data bits of the read data RDTA to output a comparison signal CS indicating a result of the comparison. The comparison signal CS may include multiple comparison bits and each of the multiple comparison bits may indicate whether a respective corresponding pair of bits are the same with respect to each other. The pass/fail determinator 453 compares a first number of first bits having a first logic level, of the comparison bits in the comparison signal CS with a reference number RN and outputs the pass/fail signal P/F indicating a result of the comparison. The pass/fail determinator 453 may be implemented by a comparator circuit. Since the first number of bits having a first logic level, of the comparison bits in the comparison signal CS denotes that the respective corresponding bits are different, the pass/fail determinator 453 outputs the P/F indicating the fail of the write operation when the first number is greater than the reference number RN. The pass/fail determinator 453 outputs the P/F indicating the pass of the write operation when the first number is smaller than or equal to the reference number RN.

The reference number RN may be determined by considering an error correction capability of the ECC engine 120 in the memory controller 100. The first through fifth sub control signals CTL31~CTL35 may be included in the third control signal CTL3. For example, if all bits of the read data DTA and the write data WDTA are the same except for one bit and the ECC engine 120 has an error correction capability of 1 bit, the pass/fail determinator 453 can output a P/F indicating the pass of the write operation.

Figure 12:
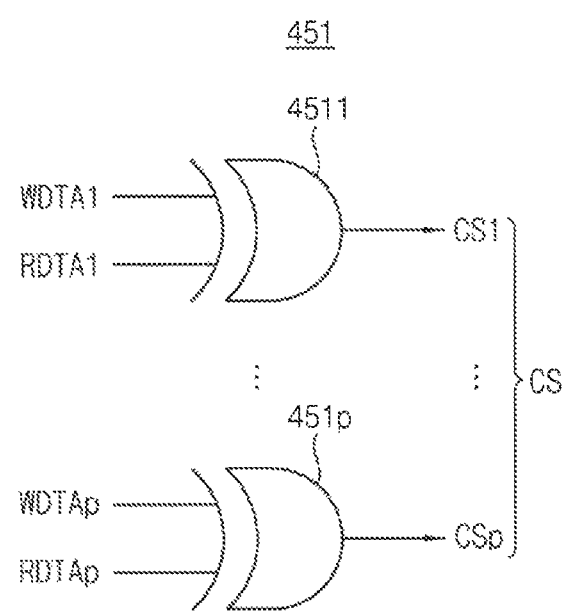
FIG. 12 is a circuit diagram illustrating the bit comparator circuit in the verify circuit in FIG. 11 according to an exemplary embodiment of the inventive concept.

FIG. 12 is a circuit diagram illustrating the bit comparator circuit in the verify circuit in FIG. 11 according to an exemplary embodiment of the inventive concept.

Referring to FIG. 12, the bit comparator circuit 451 includes a plurality of exclusive OR gates 4511~451p (q is a natural number greater than two). Each of the exclusive OR gates 4511~451p compares a corresponding pair of bits (WDTA1, RDTA1)~(WDTAp, RDTAp) of the first data bits of the write data WDTA and the second data bits of the read data RDTA and outputs a corresponding bit of the comparison bits CS1~CSp of the comparison signal CS.

Figure 13:
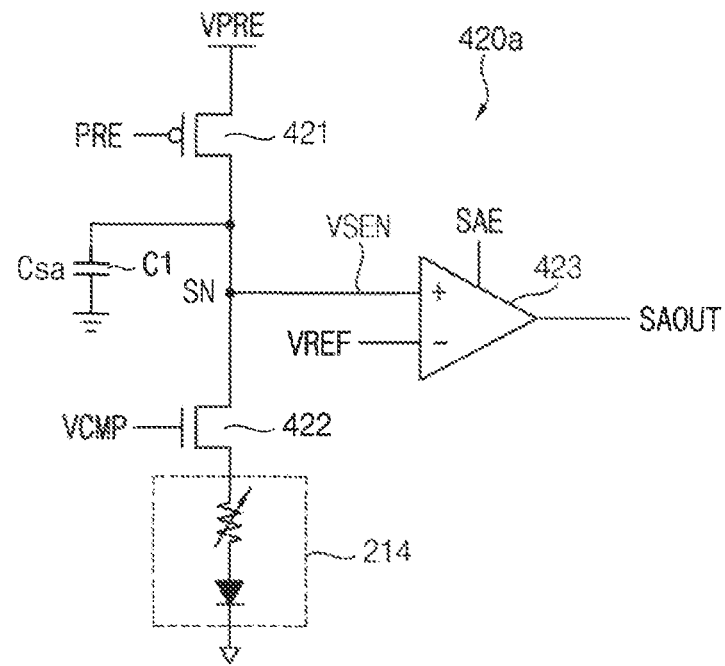
FIGS. 13 and 14 are circuit diagrams illustrating examples of the sense amplifier in FIG. 11 according to exemplary embodiments of the inventive concept.
Figure 14:
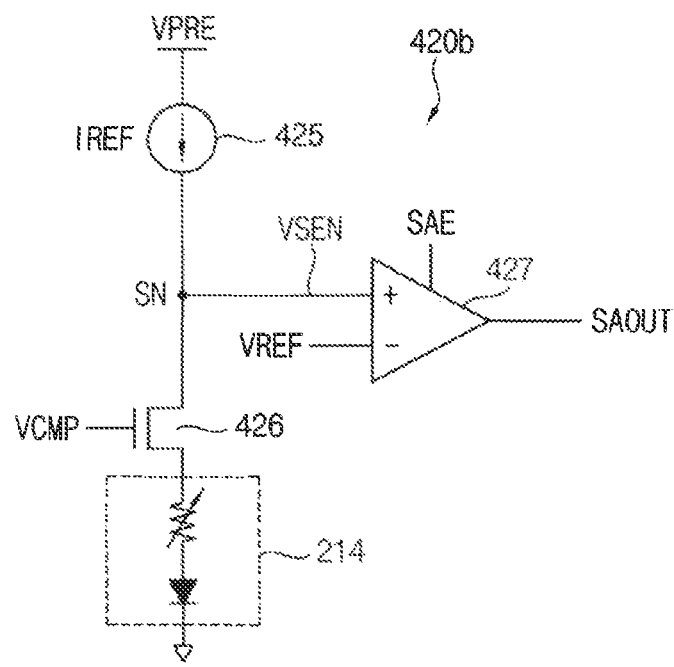

FIGS. 13 and 14 are circuit diagrams illustrating examples of the sense amplifier in FIG. 11 according to exemplary embodiments of the inventive concept.

FIG. 13 illustrates a sense amplifier that is applied to a voltage sensing scheme, and FIG. 14 illustrates a sense amplifier that is applied to a current sensing scheme.

Referring to FIG. 13, a sense amplifier 420a includes a precharge transistor 421, a capacitor C1, a clamping transistor 422 and a comparator 423 (e.g., an operational amplifier). During a bit-line set-up interval, a capacitance Csa of the capacitor C1 is precharged by a precharge voltage VPRE. A precharging operation is controlled by the precharge transistor 421, e.g., while a precharge enable signal PRE is activated. For example, the precharge enable signal PRE may be applied to a gate of the precharge transistor 421. The precharge voltage VPRE is provided to the capacitor C1 via the precharge transistor 421.

The clamping transistor 422 is disposed to appropriately adjust a voltage of a sensing node SN and is controlled in response to the clamping signal VCMP. For example, the clamping signal VCMP is applied to a gate of the clamping transistor 422. For example, a level of a voltage VSEN of the sensing node SN may be changed via a clamping operation to a level that is appropriate to be sensed by the comparator 423. Due to a voltage pre-charged in the capacitor C1, a current flows via the memory cell 214, and the level of the voltage VSEN of the sensing node SN is gradually decreased due to an amount of charge that is output via a ground terminal. A speed at which the level of the voltage VSEN of the sensing node SN decreases varies according to a resistance value of a variable resistor. According to the result of comparing the level of the voltage VSEN of the sensing node Sn and a level of the reference voltage VREF at a predetermined point of time, data may be sensed. The comparator 423 compares the level of the voltage VSEN of the sensing node Sn and the level of the reference voltage VREF in response to enabled sensing enable signal SAE to provide an output voltage SAOUT.

Referring to FIG. 14, a sense amplifier 420b includes a current source 425, a clamping transistor 426 and a comparator 427. The current source 425 generates the reference current IREF and the reference current IREF is provided to the memory cell 214 via the clamping transistor 426. For example, the clamping signal VCMP is applied to a gate of the clamping transistor 426. A level of a voltage VSEN of a sensing node SN varies according to a resistance value of a variable resistor in the memory cell 214. According to the result of comparing the level of the voltage VSEN of the sensing node SN and a level of the reference voltage VREF, data may be sensed. The comparator 427 compares the level of the voltage VSEN of the sensing node Sn and the level of the reference voltage VREF in response to enabled sensing enable signal SAE to provide an output voltage SAOUT.

Figure 15:
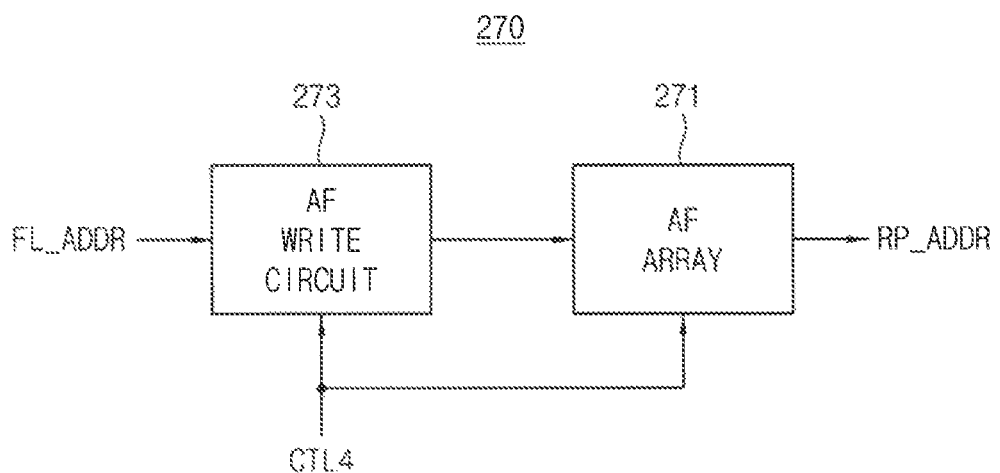
FIG. 15 is a block diagram illustrating an example of the anti-fuse box in the memory device of FIG. 3 according to an exemplary embodiment of the inventive concept.

FIG. 15 is a block diagram illustrating an example of the anti-fuse box in the memory device of FIG. 3 according to an exemplary embodiment of the inventive concept.

Referring to FIG. 15, the anti-fuse box 270 includes an anti-fuse array 271 and an anti-fuse write circuit 273. The anti-fuse array 271 may include a plurality of anti-fuses.

The anti-fuse array 271 is a nonvolatile memory for storing the fail address FL_ADDR. The anti-fuse array 271 provides the repair address RP_ADDR to the row decoder 220 based on the stored fail address FL_ADDR, which is determined in response to the fourth control signal CTL4 from the control circuit 300. If the fail address is input when a write or read operation is performed, a word-line connected to the redundancy cell array is selected instead of a word-line corresponding to the fail address by the repair address RP_ADDR.

The anti-fuse write circuit 273 is a write circuit for programming the anti-fuse array 271. The anti-fuse write circuit 273 programs the fail address FL_ADDR into the anti-fuse array 471 in response to the fourth control signal CTL4. The anti-fuse write circuit 273 may electrically cut (or "open"), or alternatively, short, a fuse corresponding to a word-line connected to a memory cell judged to be a failed cell among fuses included in the anti-fuse array 271 in response to the fourth control signal CTL4.

Figure 16:
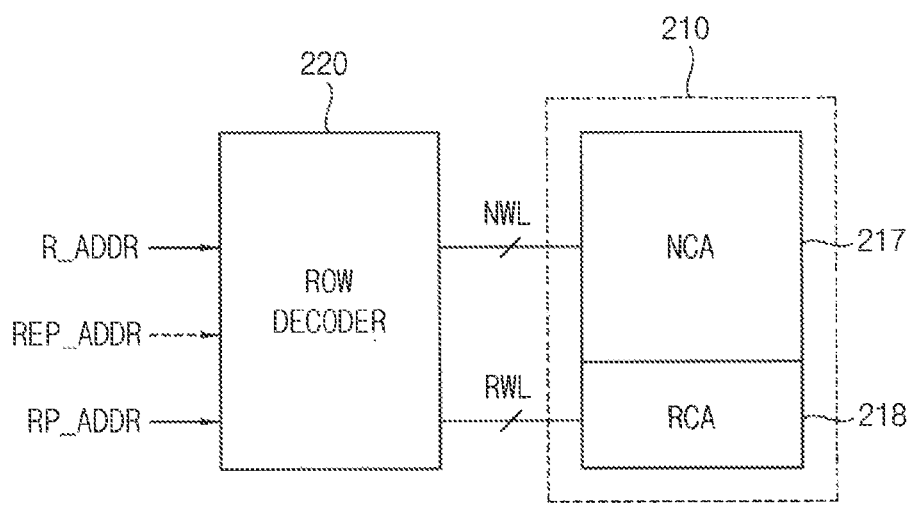
FIG. 16 illustrates the row decoder and the memory cell array in the memory device of FIG. 3.

FIG. 16 illustrates the row decoder and the memory cell array in the memory device of FIG. 3 according to an exemplary embodiment.

Referring to FIG. 16, the memory cell array 210 includes a normal cell array 217 and a redundancy cell array 218.

The normal cell array 217 includes a plurality of normal cells that store data. The normal cells in the normal cell array 217 are coupled to the row decoder 220 through a normal word-line NWL. The redundancy cell array 218 includes a plurality of redundancy cells for replacing failed cells in the normal cell array 217. The redundancy cells may have the same constitution and operation principle as the normal cells, so as to substitute for failed cells in a manner that doesn't detract from memory operation. The redundancy cells are connected to the row decoder 220 through a redundancy word-line RWL.

The row decoder 220 decodes the row address R_ADDR to select a part of word-lines of the memory cell array 210. The row decoder 220 selects a part of the normal word-line NWL and the redundancy word line RWL using the decoded row address RA, the repair address RP_ADDR provided from the anti-fuse box 270 and the replacement address REP_ADDR provided from the control circuit 300.

Figure 17:
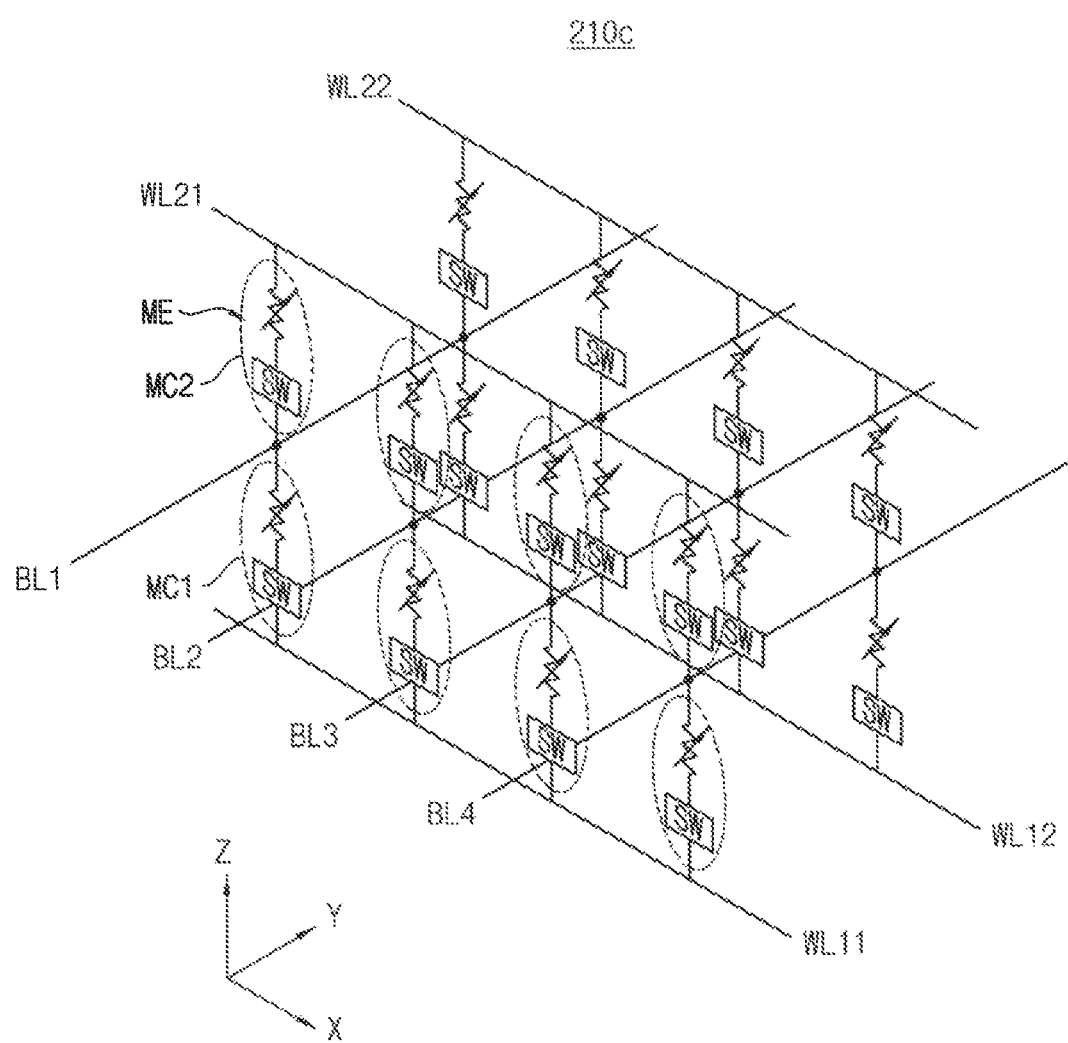
FIG. 17 is an equivalent circuit diagram illustrating an example of the memory cell array according to an exemplary embodiment of the inventive concept.

FIG. 17 is an equivalent circuit diagram illustrating an example of the memory cell array according to an exemplary embodiment of the inventive concept.

Referring to FIG. 17, a memory cell array 210c includes lower word-lines WL11 and WL12, which extend in a first direction X and are spaced apart from each other in a second direction Y perpendicular to the first direction X, and upper word-lines WL21 and WL22, which extend in the first direction X and are spaced apart from each other in the second direction Y. The upper word-lines WL21 and WL22 are spaced apart from the lower word-lines WL11 and WL12 in a third direction Z perpendicular to the first and second directions X and Y. In addition, the memory cell array 210c includes common bit-lines BL1, BL2, BL3, and BL4, which are spaced apart from each other in the first direction X and spaced apart from the upper word-lines WL21 and WL22 and the lower word lines WL11 and WL12 in the third direction Z, and extend in the second direction Y.

First and second memory cells MC1 and MC2 are disposed, respectively, between the common bit-lines BL1, BL2, BL3, and BL4 and the lower word-lines WL11 and WL12, and between the common bit-lines BL1, BL2, BL3, and BL4 and the upper word-lines WL21 and WL22. For example, the first memory cells MC1 may be arranged at respective intersections of the common bit-lines BL1, BL2, BL3, and BL4 and the lower word-lines WL11 and WL12, and each of the first memory cells MC1 may include a variable resistance pattern ME for storing data and a selection device SW for selecting the variable resistance pattern ME. The second memory cells MC2 may be arranged at respective intersections of the common bit-lines BL1, BL2, BL3, and BL4 and the upper word-lines WL21 and WL22, and each of the second memory cells MC2 may also include the variable resistance pattern ME for storing data and the selection device SW for selecting the variable resistance pattern ME.

The first and second memory cells MC1 and MC2 may have substantially the same structure and may be arranged in the third direction Z. For example, in the first memory cell MC1 arranged between the lower word-line WL11 and the common bit-line BL1, the selection device SW may be electrically connected to the lower word-line WL11, the variable resistance pattern ME may be electrically connected to the common bit-line BL1, and the variable resistance pattern ME and the selection device SW may be connected in series to each other. Similarly, in the second memory cell MC2 arranged between the upper word-line WL21 and the common bit-line BL1, the variable resistance pattern ME may be electrically connected to the upper word-line WL21, the selection device SW may be electrically connected to the common bit-line BL1, and the variable resistance pattern ME and the selection device SW may be connected in series to each other.

Figure 18:
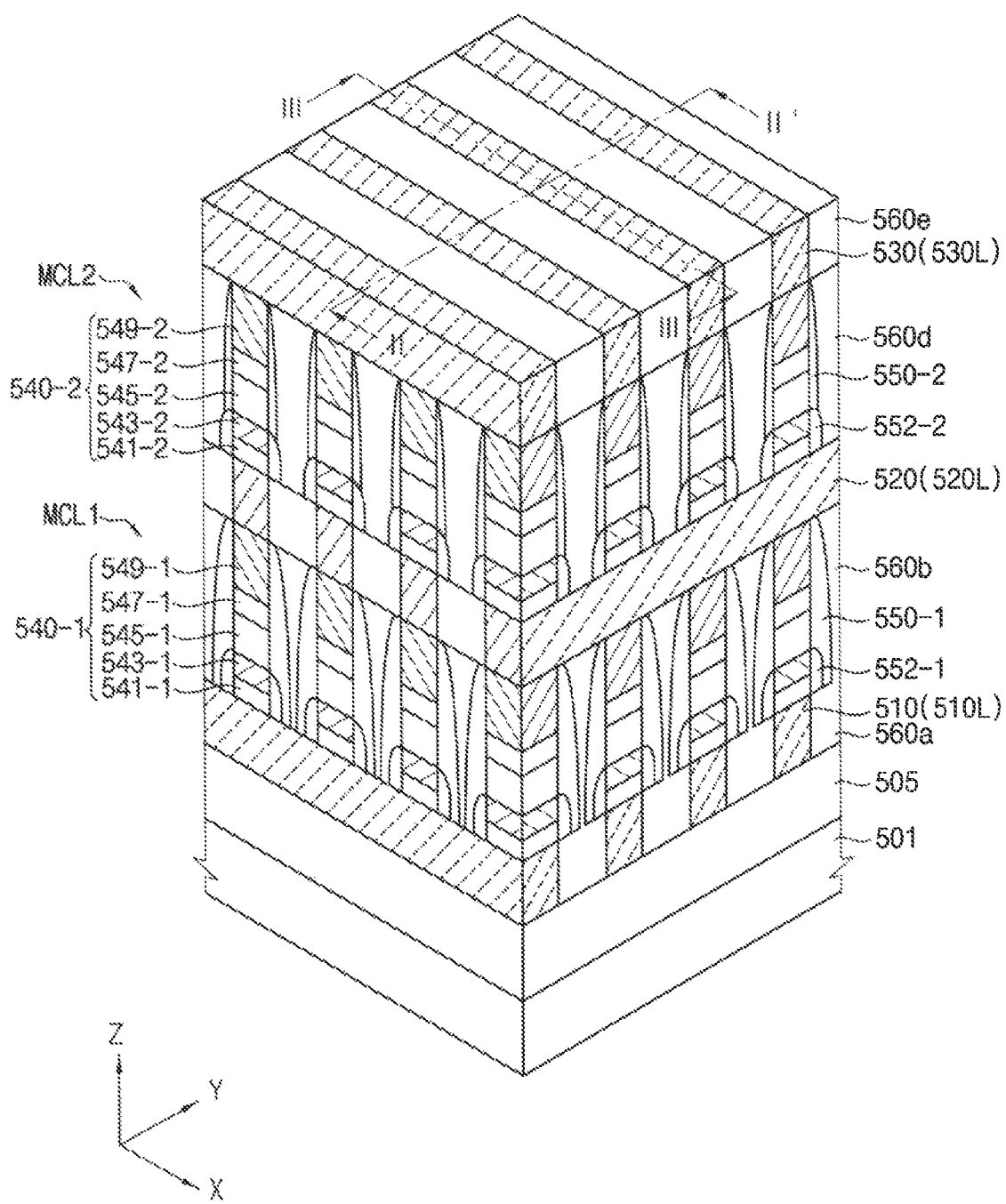
FIG. 18 is a perspective view of a memory device according to an exemplary embodiment of the inventive concept.
Figure 19:
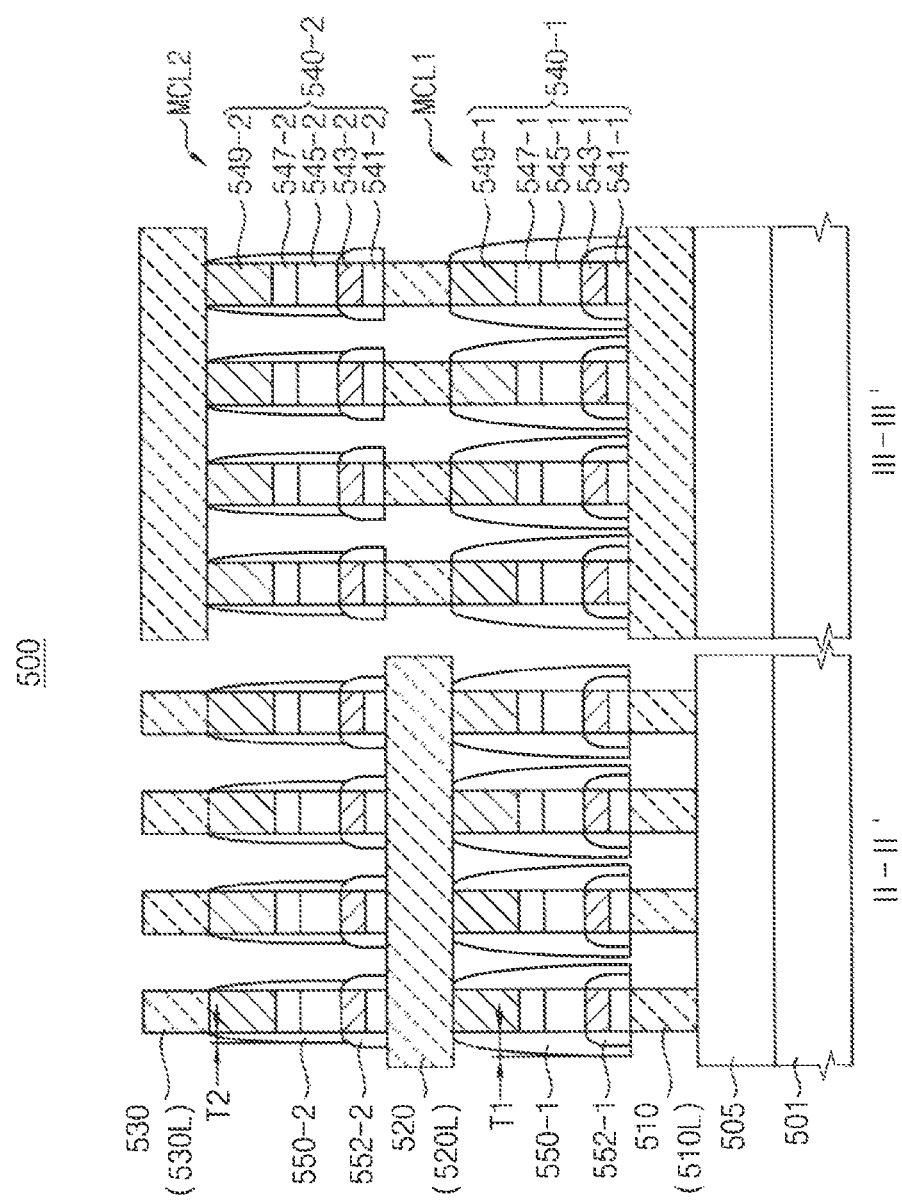
FIG. 19 is a sectional view taken along lines II-II, and of FIG. 18.

FIG. 18 is a perspective view of a memory device according to an exemplary embodiment and FIG. 19 is a sectional view taken along lines II-II, and III-III' of FIG. 18. To reduce complexity in the drawings and to provide a better understanding of the inventive concept, insulating layers 560a, 560b, 560c, 560d, and 560e are omitted from FIG. 19.

Referring to FIGS. 18 and 19, a memory device 500 includes a substrate 501, a first electrode line layer 510L, a second electrode line layer 520L, a third electrode line layer 530L, a first memory cell layer MCL1, a second memory cell layer MCL2, first spacers 550-1, and second spacers 550-2.

As shown in FIGS. 18 and 19, an interlayered insulating layer 505 is arranged on the substrate 501. The interlayered insulating layer 505 may be formed of an oxide material (e.g., silicon oxide) or a nitride material (e.g., silicon nitride), and may be used to electrically separate the first electrode line layer 510L from the substrate 501. Although, in the memory device 500 according to the present embodiment, the interlayered insulating layer 505 is arranged on the substrate 501, this is just an example of the present embodiment. For example, in the memory device 500 according to the present embodiment, an integrated circuit layer may be arranged on the substrate 501, and memory cells may be arranged on the integrated circuit layer. The integrated circuit layer may include, for example, a peripheral circuit for operation of the memory cells and/or a core circuit for calculations. Here, the structure, in which an integrated circuit layer including a peripheral circuit and/or a core circuit is arranged on a substrate and memory cells are arranged on the integrated circuit layer, may be referred to as a 'cell-on-peripheral (COP) structure'.

The first electrode line layer 510L may include a plurality of first electrode lines 510, which extend in the first direction X and are arranged in parallel to each other and spaced apart from each other in the second direction Y. The second electrode line layer 520L may include a plurality of second electrode lines 520, which extend in the second direction Y and are arranged in parallel to each other and spaced apart from each other in the first direction X. In addition, the third electrode line layer 530L may include a plurality of third electrode lines 530, which extend in the first direction X and are arranged in parallel to each other and spaced apart from each other in the second direction Y.

In operational aspects of a memory device, the first and third electrode lines 510 and 530 may serve as word-lines, and the second electrode lines 520 may serve as bit-lines. When the first and third electrode lines 510 and 530 serve as the word-lines, the first electrode lines 510 may serve as lower word-lines and the third electrode lines 530 may serve as upper word-lines. In addition, the second electrode lines 520 may be shared by the lower word-lines and the upper word-lines. That is, the second electrode lines 520 may serve as common bit-lines. Each of the first electrode lines 510, the second electrode lines 520, and the third electrode lines 530 may include, for example, metals, conductive metal nitrides, conductive metal oxides, or combinations thereof.

The first memory cell layer MCL1 includes a plurality of first memory cells 540-1, which are spaced apart from each other in the first and second directions X and Y and serve as the first memory cells MC1 of FIG. 17. The second memory cell layer MCL2 includes a plurality of second memory cells 540-2, which are spaced apart from each other in the first and second directions X and Y and serve as the second memory cells MC2 of FIG. 17. As shown in FIG. 18, the first electrode lines 510 and the second electrode lines 520 intersect each other, and the second electrode lines 520 and the third electrode lines 530 intersect each other. The first memory cells 540-1 are disposed between the first electrode line layer 510L and the second electrode line layer 520L and at respective intersections of the first electrode lines 510 and the second electrode lines 520, and are connected to the first electrode lines 510 and the second electrode lines 520. The second memory cells 540-2 are disposed between the second and third electrode line layers 520L and 530L and at respective intersections of the second and third electrode lines 520 and 530, and are connected to the second and third electrode lines 520 and 530.

In an embodiment, each of the first and second memory cells 540-1 and 540-2 has a pillar-shaped structure with a rectangular section. Each of the first memory cells 540-1 and each of the second memory cells 540-2 include, respectively, a lower electrode 541-1 and a lower electrode 541-2, a selection device 543-1 and a selection device 543-2, an intermediate electrode 545-1 and an intermediate electrode 545-2, a heating electrode 547-1 and a heating electrode 547-2, and a variable resistance pattern 549-1 and a variable resistance pattern 549-2. Since the first and second memory cells 540-1 and 540-2 have substantially the same structure, the following description will be given with reference to the first memory cells 540-1, for convenience of discussion.

The first spacers 550-1 are provided to enclose side surfaces of the first memory cells 540-1. The second spacers 550-2 are provided to enclose side surfaces of the second memory cells 540-2. Since the first and second spacers 550-1 and 550-2 are provided to enclose the side surfaces of the first and second memory cells 540-1 and 540-2, the first and second spacers 550-1 and 550-2 may be used to protect the first and second memory cells 540-1 and 540-2 (in particular, the variable resistance patterns 549-1 and 549-2 and/or the selection devices 543-1 and 543-2).

In the memory device 500, the first spacer 550-1 has a first thickness T1, and the second spacer 550-2 has a second thickness T2. In an embodiment, the first thickness T1 and greater than the second thickness T2. In the memory device 500, by thickly forming the first spacers 550-1 of the first memory cells 540-1 and thinly forming the second spacers 550-2 of the second memory cells 540-2, resistance characteristics of the first and second memory cells 540-1 and 540-2 may be enhanced.

The memory device 500 further includes a first inner spacer 552-1 and a second inner spacer 552-2. The first inner spacer 552-1 is provided to cover the lower electrode 541-1 and the selection device 543-1 of the first memory cell 540-1, and the second inner spacer 552-2 is provided to cover the lower electrode 541-2 and the selection device 543-2 of the second memory cell 540-2. The first and second inner spacers 552-1 and 552-2 may be formed, using a process separate from that used to form the first and second spacers 550-1 and 550-2, for more effective protection of the selection devices 543-1 and 543-2. However, in an exemplary embodiment of the inventive concept, the first and second inner spacers 552-1 and 552-2 are omitted.

Figure 20:
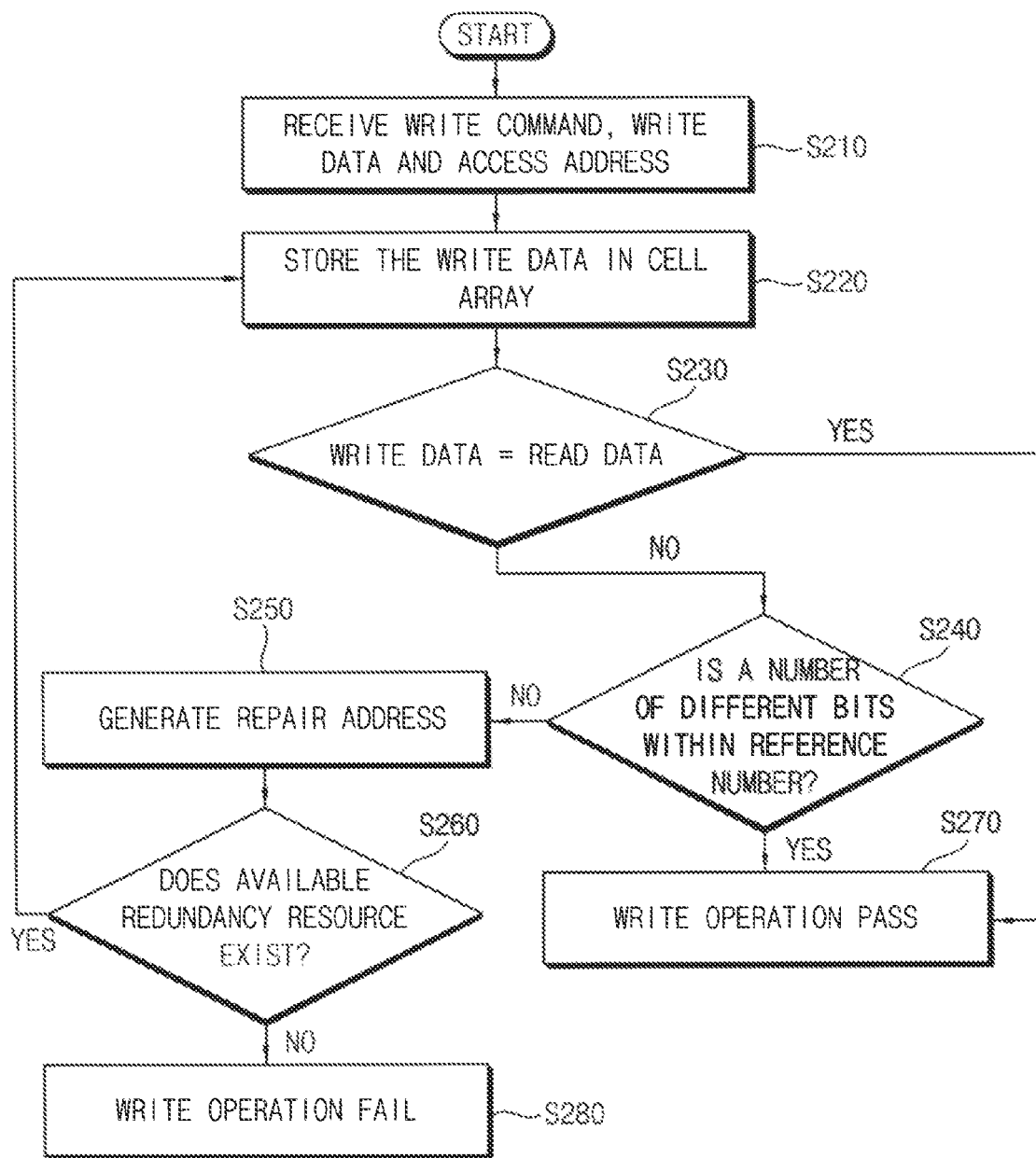
FIG. 20 is a flow chart illustrating a method of operating a memory device according to an exemplary embodiment of the inventive concept.

As shown in FIG. 19 and FIG. 20, a first insulating layer 560a is arranged between the first electrode lines 510, and a second insulating layer 560b is arranged between the first memory cells 540-1 of the first memory cell layer MCL1. In addition, a third insulating layer 560c is arranged between the second electrode lines 520, a fourth insulating layer 560d is arranged between the second memory cells 540-2 of the second memory cell layer MCL2, and a fifth insulating layer 560e is arranged between the third electrode lines 530.

FIG. 20 is a flow chart illustrating a method of operating a memory device according to an exemplary embodiment of the inventive concept.

Referring to FIGS. 1 through 20, in a method of operating a memory device 200 including a memory cell array 210 that includes a plurality of nonvolatile memory cells to be overwritten, the memory device 200 receives a write command, write data and an access address ADDR from the memory controller (S210). A write/read circuit 400 performs a write operation to write write data WDTA in a target page of the memory cell array 210 (S220). A sense amplifier 420 senses data from the target page and a verify circuit 450 verifies the write operation by comparing read data RDTA read from the target page with the write data WDTA stored in a write buffer 430 (S230). When the read data RDTA is the same as the write data WDTA (YES in S230), the verify circuit 450 notifies of the pass of the write operation of the control circuit 300 (S270). When the read data RDTA is not the same as the write data WDTA (NO in S230), the verify circuit 450 determines whether a first number of different bits in the write data and the read data is within a reference number RN based on a result of the verification (S240).

When the first number exceeds the reference number RN (NO in S240), a control circuit 300 generates a repair address RP_ADDR to replace the access address R_ADDR (S250) and the control circuit 300 determines whether available redundancy resources exist in the memory cell array 210 (S260). When the available redundancy resources exist in the memory cell array 210 (YES in S260), the control circuit 300 controls the write/read circuit 400 to store the write data WDTA in a redundancy page designated by the repair address RP_ADDR (S220), and the verify circuit 450 verifies the pass or the fail of the write operation (S230 and S240). When the available redundancy resources do not exist in the memory cell array 210 (NO in S260), the control circuit 300 notifies of the fail of the write operation of the memory controller 100 (S280).

When the first number is within the reference number RN (YES in S240), the verify circuit 450 notifies of the pass of the write operation of the control circuit 300 (S270).

Figure 21:
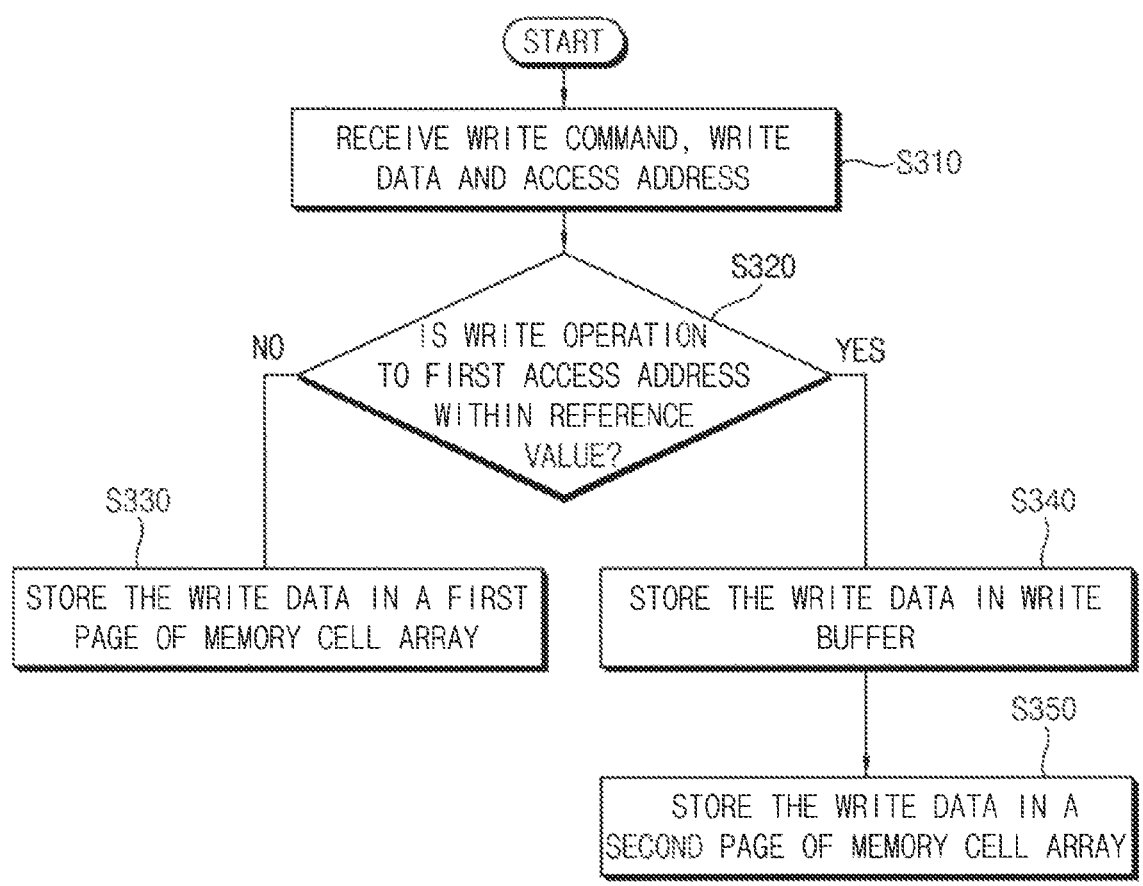
FIG. 21 is a flow chart illustrating a method of operating a memory device according to an exemplary embodiment of the inventive concept.

FIG. 21 is a flow chart illustrating a method of operating a memory device according to an exemplary embodiment of the inventive concept.

Referring to FIGS. 1 through 19 and 21, in a method of operating a memory device 200 including a memory cell array 210 that includes a plurality of nonvolatile memory cells to be overwritten, the memory device 200 receives a write command, write data and a first access address ADDR from the memory controller (S310). A control circuit determines whether a row access count based on the first access address is within a reference value CRV (S320). When the row access count is within the reference value CRV (YES in S320), a write/read circuit 400 stores write data WDTA in a first page designated by the first access address, of the memory cell array 210 (S330). When the row access count exceeds the reference value CRV (NO in S320), the write/read circuit 400 stores write data WDTA in a write buffer 430 instead of the first page (S340). The write/read circuit 400 stores the write data WDAT in a second page designated by a replacement address REP_ADDR, in the memory cell array 210 (S350). In an embodiment, the write-read circuit 400 stores the write data in the second page in a stand-by mode of the memory device 200.

Accordingly, the memory device 200 may increase endurance of the memory cell array 210 by writing write data in a redundancy page when a difference of bits between the write data and the read data exceeds a reference number or by storing the write data in a second page instead of a first page when the first page is intensively accessed.

Figure 22:
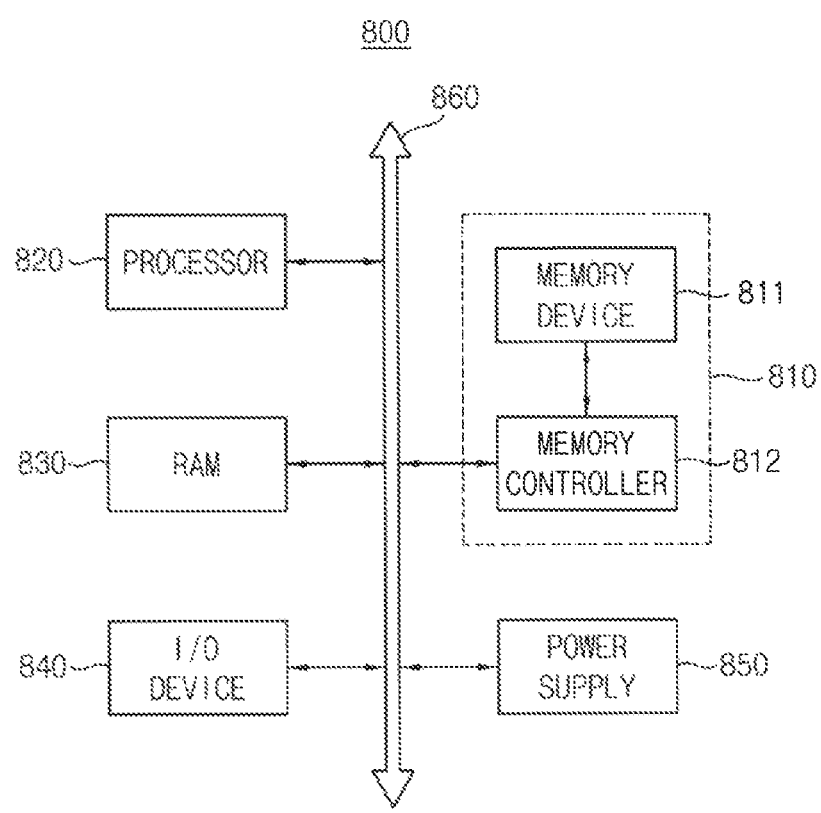
FIG. 22 is a block diagram illustrating a computing system employing a memory system according to an exemplary embodiment of the inventive concept.

FIG. 22 is a block diagram illustrating a computing system employing a memory system according to an exemplary embodiment of the inventive concept.

Referring to FIG. 22, a computing system 800 includes a memory system 810, a processor 820, a random access memory (RAM) 830, an input/output (I/O) device 840, and a power supply 850. Furthermore, the memory system 810 includes a memory device 811 and a memory controller 812.

Although not shown, the computing system 810 may further include ports which communicate with devices, such as, for example, a video card, a sound card, a memory card, an USB device, or another electronic device. The computing system 800 may be a personal computer or a mobile electronic device such as a notebook computer, a mobile phone, a personal digital assistant (PDA), or a camera.

The processor 820 may perform specific calculations or tasks. The processor 820 may be a microprocessor or a central processing unit (CPU). The processor 820 may communicate with the RAM 830, the I/O device 840, and the memory system 810 through a bus 860 such as, for example, an address bus, a control bus, or a data bus. Here, the memory system 810 may include a resistive memory device described with reference to FIGS. 1 through 19.

In an exemplary embodiment, the processor 820 is connected to an expansion bus such as a peripheral component interconnection (PCI) bus. The RAM 830 may store data and information for operating the computing system 800. The I/O device 840 may include one or more input units, such as, for example, a keypad, a keyboard, a mouse, etc. and one or more output units, such as, for example, a display or a printer. The power supply 850 may supply an operating voltage which is necessary for operation of the computing system 800.

The foregoing is illustrative of exemplary embodiments. Although a few exemplary embodiments have been described, those skilled in the art will readily appreciate that many modifications are possible in the exemplary embodiments without materially departing from the present inventive concept. Accordingly, all such modifications are intended to be included within the scope of the present inventive concept.

What is claimed is:

1. A method of operating a memory device including a memory cell array that includes a plurality of nonvolatile memory cells, the method comprising: performing, by a write circuit of the memory device, a write operation to write write data in a target page of the memory cell array associated with an access address; verifying, by the write circuit, the write operation by comparing a read data read from the target page with the write data; providing, by a control circuit of the memory device, the access address as a fail address to an anti-fuse array of the memory device when a first number of different bits in the write data and the read data exceeds a reference number according to a result of the verifying; outputting, by the anti-fuse array of the memory device, a repair address to replace the access address in response to the fail address; and writing, by the write circuit, the write data in a redundancy page, designated by the repair address, in the memory cell array, wherein the result of the verifying is provided to the control circuit as a pass/fail signal and the comparing comprises: comparing corresponding bits of first p data bits of the write data and second p data bits of the read data to output a comparison signal, p being a natural number greater than one; and comparing a first number of first bits, each having a first logic level, of the comparison signal with a reference number to output the pass/fail signal.

2. The method of claim 1, wherein the memory cell array includes a three dimensional memory call array and each of the nonvolatile memory cells has a programmable resistance representing stored data.

3. The method of claim 1, wherein the pass/fail signal indicates the fail of the write operation when the first number of the first bits is greater than the reference number.

4. The method of claim 1, wherein the pass/fail signal indicates the pass of the write operation when the first number of the first bits is smaller than or equal to the reference number.

5. The method of claim 1, further comprising:
- determining, by the control circuit, whether an access count associated with the access address exceeds a reference value;
- generating, by the control circuit, a replacement address associated with the access address when the access count exceeds the reference value; and
- writing, by the write circuit, the write data in another redundancy page, designated by the replacement address, in the memory cell array.

6. The method of claim 5, wherein the control circuit generates the replacement address without using the anti-fuse array.

7. The method of claim 5, wherein the control circuit accesses a table using the access address to retrieve the replacement address.

\* \* \* \* \*